(12) United States Patent
Negley et al.

(10) Patent No.: US 7,821,194 B2
(45) Date of Patent: Oct. 26, 2010

(54) SOLID STATE LIGHTING DEVICES INCLUDING LIGHT MIXTURES

(75) Inventors: Gerald H. Negley, Chapel Hill, NC (US); Antony P. van de Ven, Sai Kung (HK)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/557,036

(22) Filed: Sep. 10, 2009

(65) Prior Publication Data

US 2010/0002440 A1    Jan. 7, 2010

Related U.S. Application Data

(63) Continuation-in-part of application No. 11/736,761, filed on Apr. 18, 2007, which is a continuation-in-part of application No. 11/948,021, filed on Nov. 30, 2007.

(60) Provisional application No. 60/792,859, filed on Apr. 18, 2006, provisional application No. 60/793,524, filed on Apr. 20, 2006, provisional application No. 60/868,134, filed on Dec. 1, 2006.

(51) Int. Cl.
*H01J 1/62* (2006.01)
*F21V 9/00* (2006.01)
*F21S 4/00* (2006.01)

(52) U.S. Cl. .................. 313/498; 313/501; 313/502; 313/503; 362/230; 362/231; 362/249.02

(58) Field of Classification Search ............ 313/498, 313/501–503; 362/230–231, 249.02
See application file for complete search history.

(56) References Cited

U.S. PATENT DOCUMENTS 4,120,026 A    10/1978    Tsuchihashi et al.
4,710,699 A    12/1987    Miyamoto
5,477,436 A    12/1995    Bertling et al.
5,803,579 A *  9/1998    Turnbull et al. ............. 362/516

(Continued)

FOREIGN PATENT DOCUMENTS

DE    39 16 875    12/1990

(Continued)

OTHER PUBLICATIONS

U.S. Appl. No. 60/792,859, filed Apr. 18, 2006, Van De Ven.

(Continued)

*Primary Examiner*—Toan Ton
*Assistant Examiner*—Britt D Hanley
(74) *Attorney, Agent, or Firm*—Myers Bigel Sibley & Sajovec

(57) ABSTRACT

A solid state lighting apparatus includes a plurality of light emitting diodes (LEDs). Each of the LEDs includes an LED device configured to emit light having about a first dominant wavelength and a phosphor configured to receive at least some of the light emitted by the LED device and responsively emit light having about a second dominant wavelength. A combined light emitted by the LED device and the phosphor of a first one of the plurality of LEDs has a first color point and a combined light emitted by the LED device and the phosphor of a second one of the plurality of LEDs has a second color point that falls outside a seven step Macadam ellipse around the first color point.

20 Claims, 9 Drawing Sheets

U.S. PATENT DOCUMENTS

| | | |
|---|---|---|
| 5,851,063 A | 12/1998 | Doughty et al. |
| 5,962,971 A | 10/1999 | Chen |
| 5,998,925 A | 12/1999 | Shimizu et al. |
| 6,066,861 A | 5/2000 | Hohn et al. |
| 6,069,440 A | 5/2000 | Shimizu et al. |
| 6,084,250 A | 7/2000 | Justel et al. |
| 6,132,072 A | 10/2000 | Turnbull et al. |
| 6,153,971 A | 11/2000 | Shimizu |
| 6,163,038 A | 12/2000 | Chen et al. |
| 6,212,213 B1 | 4/2001 | Weber et al. |
| 6,234,648 B1 | 5/2001 | Borner et al. |
| 6,245,259 B1 | 6/2001 | Hohn et al. |
| 6,252,254 B1 | 6/2001 | Soules et al. |
| 6,255,670 B1 | 7/2001 | Srivastava et al. |
| 6,294,800 B1 | 9/2001 | Duggal et al. |
| 6,319,425 B1 | 11/2001 | Tasaki et al. |
| 6,337,536 B1 | 1/2002 | Matsubara et al. |
| 6,373,188 B1 | 4/2002 | Johnson et al. |
| 6,396,081 B1 | 5/2002 | Tews et al. |
| 6,429,583 B1 | 8/2002 | Levinson et al. |
| 6,441,558 B1 | 8/2002 | Muthu et al. |
| 6,469,322 B1 | 10/2002 | Srivastava et al. |
| 6,480,299 B1 | 11/2002 | Drakopoulos et al. |
| 6,501,100 B1 | 12/2002 | Srivastava et al. |
| 6,501,102 B2 | 12/2002 | Mueller-Mach et al. |
| 6,504,179 B1 | 1/2003 | Ellens et al. |
| 6,504,301 B1 | 1/2003 | Lowery |
| 6,509,651 B1 | 1/2003 | Matsubara et al. |
| 6,513,949 B1 | 2/2003 | Marshall et al. |
| 6,538,371 B1 | 3/2003 | Duggal et al. |
| 6,547,249 B2 | 4/2003 | Collins, III et al. |
| 6,550,949 B1 | 4/2003 | Bauer et al. |
| 6,552,495 B1 | 4/2003 | Chang |
| 6,576,930 B2 | 6/2003 | Reeh et al. |
| 6,577,073 B2 | 6/2003 | Shimizu et al. |
| 6,600,175 B1 | 7/2003 | Baretz et al. |
| 6,600,324 B2 | 7/2003 | St. Germain |
| 6,608,332 B2 | 8/2003 | Shimizu et al. |
| 6,614,179 B1 | 9/2003 | Shimizu et al. |
| 6,616,862 B2 | 9/2003 | Srivastava et al. |
| 6,624,638 B2 | 9/2003 | St. Germain |
| 6,635,503 B2 | 10/2003 | Andrews et al. |
| 6,636,003 B2 | 10/2003 | Rahm et al. |
| 6,642,666 B1 | 11/2003 | St. Germain |
| 6,685,852 B2 | 2/2004 | Setlur et al. |
| 6,692,136 B2 | 2/2004 | Marshall et al. |
| 6,703,173 B2 | 3/2004 | Lu et al. |
| 6,737,801 B2 | 5/2004 | Ragle |
| 6,744,194 B2 | 6/2004 | Fukasawa et al. |
| 6,762,563 B2 | 7/2004 | St. Germain et al. |
| 6,784,463 B2 | 8/2004 | Camras et al. |
| 6,817,735 B2 | 11/2004 | Shimizu et al. |
| 6,841,804 B1 | 1/2005 | Chen et al. |
| 6,853,010 B2 | 2/2005 | Slater, Jr. et al. |
| 6,882,101 B2 | 4/2005 | Ragle |
| 6,885,035 B2 | 4/2005 | Bhat et al. |
| 6,914,267 B2 | 7/2005 | Fukasawa et al. |
| 6,936,857 B2 | 8/2005 | Doxsee et al. |
| 6,957,899 B2 | 10/2005 | Jiang et al. |
| 6,967,116 B2 | 11/2005 | Negley |
| 7,005,679 B2 | 2/2006 | Tarsa et al. |
| 7,008,078 B2 | 3/2006 | Shimizu et al. |
| 7,009,199 B2 | 3/2006 | Hall |
| 7,009,343 B2 | 3/2006 | Lim et al. |
| 7,014,336 B1 | 3/2006 | Ducharme et al. |
| 7,023,019 B2 | 4/2006 | Maeda et al. |
| 7,095,056 B2 | 8/2006 | Vitta et al. |
| 7,125,143 B2 | 10/2006 | Hacker |
| 7,135,664 B2 | 11/2006 | Vornsand et al. |
| 7,141,442 B2 | 11/2006 | Sano |
| 7,207,691 B2 * | 4/2007 | Lee et al. ..................... 362/231 |
| 7,213,940 B1 | 5/2007 | Van De Ven et al. |
| 7,213,942 B2 | 5/2007 | Jiang et al. |
| 7,217,583 B2 | 5/2007 | Negley et al. |
| 7,221,044 B2 | 5/2007 | Fan et al. |
| 7,250,715 B2 | 7/2007 | Mueller et al. |
| 7,256,557 B2 | 8/2007 | Lim et al. |
| 7,262,439 B2 | 8/2007 | Radkov |
| 7,278,760 B2 | 10/2007 | Heuser et al. |
| 7,358,954 B2 | 4/2008 | Negley et al. |
| 7,365,485 B2 | 4/2008 | Fukasawa et al. |
| 7,387,405 B2 | 6/2008 | Ducharme et al. |
| 7,417,259 B2 | 8/2008 | Sakai et al. |
| 7,422,504 B2 | 9/2008 | Maeda et al. |
| 7,453,195 B2 | 11/2008 | Radkov |
| 7,473,934 B2 | 1/2009 | Nagai et al. |
| 7,564,180 B2 * | 7/2009 | Brandes ..................... 313/501 |
| 2003/0030063 A1 | 2/2003 | Sosniak et al. |
| 2003/0042908 A1 | 3/2003 | St. Germain |
| 2003/0089918 A1 | 5/2003 | Hiller et al. |
| 2004/0046178 A1 | 3/2004 | Sano |
| 2004/0105264 A1 | 6/2004 | Spero |
| 2004/0264193 A1 | 12/2004 | Okumura |
| 2005/0030744 A1 | 2/2005 | Ducharme et al. |
| 2005/0135094 A1 * | 6/2005 | Lee et al. ..................... 362/231 |
| 2006/0012989 A1 | 1/2006 | Lee |
| 2006/0022582 A1 | 2/2006 | Radkov |
| 2006/0105482 A1 | 5/2006 | Alferink et al. |
| 2006/0113548 A1 | 6/2006 | Chen et al. |
| 2006/0138435 A1 | 6/2006 | Tarsa et al. |
| 2006/0181192 A1 | 8/2006 | Radkov et al. |
| 2006/0245184 A1 | 11/2006 | Galli |
| 2007/0001188 A1 | 1/2007 | Lee |
| 2007/0051966 A1 | 3/2007 | Hagashi et al. |
| 2007/0090381 A1 | 4/2007 | Otsuka et al. |
| 2007/0139920 A1 | 6/2007 | Van De Ven et al. |
| 2007/0139923 A1 | 6/2007 | Negley et al. |
| 2007/0170447 A1 | 7/2007 | Negley et al. |
| 2007/0171145 A1 | 7/2007 | Coleman et al. |
| 2007/0202623 A1 | 8/2007 | Gao et al. |
| 2007/0223219 A1 | 9/2007 | Medendorp, Jr. et al. |
| 2007/0236911 A1 | 10/2007 | Negley |
| 2007/0263393 A1 | 11/2007 | Van De Ven |
| 2007/0267983 A1 | 11/2007 | Van De Ven et al. |
| 2007/0274063 A1 | 11/2007 | Negley |
| 2007/0274080 A1 | 11/2007 | Negley et al. |
| 2007/0276606 A1 | 11/2007 | Radkov et al. |
| 2007/0278503 A1 | 12/2007 | Van De Ven et al. |
| 2007/0278934 A1 | 12/2007 | Van De Ven et al. |
| 2007/0279440 A1 | 12/2007 | Negley |
| 2007/0279903 A1 | 12/2007 | Negley et al. |
| 2007/0280624 A1 | 12/2007 | Negley et al. |
| 2007/0291467 A1 * | 12/2007 | Nagai et al. ..................... 362/84 |
| 2008/0007172 A1 * | 1/2008 | Tan et al. ..................... 313/512 |
| 2008/0084685 A1 | 4/2008 | Van De Ven et al. |
| 2008/0084700 A1 | 4/2008 | Van De Ven |
| 2008/0084701 A1 | 4/2008 | Van De Ven et al. |
| 2008/0088248 A1 | 4/2008 | Myers |
| 2008/0089053 A1 | 4/2008 | Negley |
| 2008/0106895 A1 | 5/2008 | Van De Ven et al. |
| 2008/0106907 A1 | 5/2008 | Trott et al. |
| 2008/0112168 A1 | 5/2008 | Pickard |
| 2008/0112170 A1 | 5/2008 | Trott et al. |
| 2008/0112183 A1 | 5/2008 | Negley |
| 2008/0130265 A1 | 6/2008 | Negley et al. |
| 2008/0130285 A1 | 6/2008 | Negley et al. |
| 2008/0130298 A1 | 6/2008 | Negley et al. |
| 2008/0136313 A1 | 6/2008 | Van De Ven et al. |
| 2008/0137347 A1 | 6/2008 | Trott et al. |
| 2008/0179602 A1 | 7/2008 | Negley et al. |
| 2008/0211416 A1 | 9/2008 | Negley et al. |
| 2008/0259589 A1 | 10/2008 | Van De Ven |
| 2008/0278928 A1 | 11/2008 | Van De Ven et al. |
| 2008/0278940 A1 | 11/2008 | Van De Ven et al. |

| | | | |
|---|---|---|---|
| 2008/0278950 | A1 | 11/2008 | Pickard et al. |
| 2008/0278952 | A1 | 11/2008 | Trott et al. |
| 2008/0304260 | A1 | 12/2008 | Van De Ven et al. |
| 2008/0304261 | A1 | 12/2008 | Van De Ven et al. |
| 2008/0304269 | A1 | 12/2008 | Pickard et al. |
| 2008/0309255 | A1 | 12/2008 | Myers et al. |
| 2008/0310154 | A1 | 12/2008 | Van De Ven et al. |
| 2009/0050907 | A1 | 2/2009 | Yuan et al. |
| 2009/0108269 | A1 | 4/2009 | Negley et al. |
| 2009/0147508 | A1 * | 6/2009 | Bertram et al. ............. 362/231 |
| 2009/0160363 | A1 | 6/2009 | Negley et al. |
| 2009/0161356 | A1 | 6/2009 | Negley et al. |
| 2009/0184616 | A1 | 7/2009 | Van De Ven et al. |
| 2009/0184666 | A1 | 7/2009 | Myers et al. |
| 2009/0246895 | A1 | 10/2009 | You et al. |

FOREIGN PATENT DOCUMENTS

| | | |
|---|---|---|
| DE | 42 28 895 | 3/1994 |
| DE | 103 35 077 | 3/2005 |
| EP | 0 838 866 A2 | 4/1998 |
| EP | 0 971 421 A2 | 1/2000 |
| EP | 1 024 399 A1 | 8/2000 |
| EP | 1 160 883 A2 | 12/2001 |
| EP | 1 193 772 A2 | 4/2002 |
| EP | 1 367 655 A1 | 12/2003 |
| EP | 1 462 711 A1 | 12/2004 |
| EP | 1 566 848 A2 | 8/2005 |
| EP | 1 571 715 A1 | 9/2005 |
| EP | 1 760 795 A2 | 3/2007 |
| EP | 1 850 383 A1 | 10/2007 |
| JP | 10-163535 | 6/1998 |
| JP | 2000-183408 | 6/2000 |
| JP | 2000- 294834 | 10/2000 |
| JP | 2001 156331 | 6/2001 |
| JP | 2001/307506 | 11/2001 |
| JP | 2002-150821 | 5/2002 |
| JP | 2003-515956 | 5/2003 |
| JP | 2003-529889 | 10/2003 |
| JP | 2004-080046 | 3/2004 |
| JP | 2004-103443 | 4/2004 |
| JP | 2004-253309 | 9/2004 |
| JP | 2004-356116 | 12/2004 |
| JP | 2004-363055 | 12/2004 |
| JP | 2005-142311 | 6/2005 |
| JP | 2007-122950 | 5/2007 |
| JP | 2007-141737 | 6/2007 |
| WO | WO 00/19546 | 4/2000 |
| WO | WO 01/41215 | 6/2001 |
| WO | WO 02/054503 | 7/2002 |
| WO | WO 2005/004202 A2 | 1/2005 |
| WO | WO 2005/013365 A2 | 2/2005 |
| WO | WO 2005/022030 | 3/2005 |
| WO | WO 2005/124877 | 12/2005 |
| WO | WO 2006/003559 | 1/2006 |
| WO | WO 2006/028312 A1 | 3/2006 |
| WO | WO 2006/061728 A2 | 6/2006 |

OTHER PUBLICATIONS

U.S. Appl. No. 60/793,524, filed Apr. 20, 2006, Van De Ven.
U.S. Appl. No. 60/868,134, filed Dec. 1, 2006, Van De Ven.
U.S. Appl. No. 60/978,880, filed Oct. 10, 2007, Van De Ven.
U.S. Appl. No. 60/990,435, filed Nov. 27, 2007, Van De Ven.
U.S. Appl. No. 60/990,439, filed Nov. 27, 2007, Negley.
U.S. Appl. No. 60/990,724, filed Nov. 28, 2007, Negley.
U.S. Appl. No. 61/022,886, filed Jan. 23, 2008, Myers.
U.S. Appl. No. 61/037,365, filed Mar. 18, 2008, Van De Ven.
U.S. Appl. No. 61/039,926, filed Mar. 27, 2008, Myers.
U.S. Appl. No. 61/041,404, filed Apr. 1, 2008, Negley.
U.S. Appl. No. 61/075,513, filed Jun. 25, 2008, Roberts.

"Cree XLamp XR-E and XR-C LED Binning and Labeling", pp. 1-15, Copyright 2007-2008 Cree, Inc. Application Note: CLD-AP12.008.
Cree® XLamp® 7090 XR-E Series LED Binning and Labeling.
International Search Report and Written Opinion corresponding to International Application No. PCT/US2007/009462; Mailing Date: Oct. 24, 2008.
International Search Report and Written Opinion corresponding to International Application No. PCT/US2007/009459; Mailing Date: Mar. 3, 2008.
International Search Report and Written Opinion corresponding to International Application No. PCT/US2008/054665; Mailing Date: Jul. 16, 2008.
International Search Report and Written Opinion corresponding to International Application No. PCT/US2007/086593; Mailing Date: Apr. 18, 2008.
International Search Report and Written Opinion corresponding to International Application No. PCT/US2006/048654; Mailing Date: Feb. 13, 2008.
International Search Report and Written Opinion corresponding to International Application No. PCT/US2008/063042; Mailing Date: Jul. 21, 2008.
International Search Report and Written Opinion corresponding to International Application No. PCT/US2007/086027; Mailing Date: Apr. 25, 2008.
International Search Report and Written Opinion corresponding to International Application No. PCT/US2008/063021; Mailing Date: Aug. 5, 2008.
International Search Report and Written Opinion corresponding to International Application No. PCT/US2008/051633; Mailing Date: Aug. 14, 2008.
International Search Report and Written Opinion corresponding to International Application No. PCT/US2008/063016; Mailing Date: Aug. 5, 2008.
International Search Report and Written Opinion corresponding to International Application No. PCT/US2008/063027; Mailing Date: Jul. 23, 2008.
International Search Report and Written Opinion corresponding to International Application No. PCT/US2007/09629; Mailing Date: Feb. 11, 2008.
International Search Report and Written Opinion corresponding to International Application No. PCT/US2008/079299; Mailing Date: Jan. 9, 2009.
International Search Report and Written Opinion corresponding to International Application No. PCT/US2008/063020; Mailing Date: Jul. 21, 2008.
International Search Report and Written Opinion corresponding to International Application No. PCT/US2009/003768; Mailing Date: Sep. 24, 2009.
Krames, "Lumileds Lighting, Light from Silicon Valley" Progress and Future Direction of LED Technology, SSL Workshop, Nov. 13, 2003, pp. 1-21.
"LED Binning" Cree LED Light, pp. 1-12 (2007).
Mirhosseini, et al. "Improved Color Rendering and Luminous Efficacy in Phosphor-Converted White Light-Emitting Diodes by Use of Dual-Blue Emitting Active Regions" Optical Society of America 17(13):10806-10813 (2009).
Ohno, "Simulation Analysis of White LED Spectra and Color Rendering" National Institute of Standards and Technology, USA, pp. 1-4.
"Specifications for the Chromaticity of Solid State Lighting Products" American National Standard Lighting Group, ANSI_NEMA_ANSLG C78.377-2008, pp. 1-17 (Jan. 9, 2008).
Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.

* cited by examiner

FIGURE 4A  FIGURE 4B

SOLID STATE LIGHTING DEVICES INCLUDING LIGHT MIXTURES

CROSS REFERENCE TO RELATED APPLICATIONS

The present application is a continuation in part of U.S. patent application Ser. No. 11/736,761, filed Apr. 18, 2007, entitled "LIGHTING DEVICE AND LIGHTING METHOD," which claims the benefit of U.S. Provisional Patent Application No. 60/792,859, filed on Apr. 18, 2006, entitled "LIGHTING DEVICE AND LIGHTING METHOD" (inventors: Gerald H. Negley and Antony Paul van de Ven), U.S. Provisional Patent Application No. 60/793,524, filed on Apr. 20, 2006, entitled "LIGHTING DEVICE AND LIGHTING METHOD" (inventors: Gerald H. Negley and Antony Paul van de Ven) and U.S. Provisional Patent Application No. 60/868,134, filed on Dec. 1, 2006, entitled "LIGHTING DEVICE AND LIGHTING METHOD" (inventors: Gerald H. Negley and Antony Paul van de Ven). The present application is a continuation in part of U.S. patent application Ser. No. 11/948,021, filed Nov. 30, 2007, entitled "LIGHTING DEVICE AND LIGHTING METHOD," which claims the benefit of U.S. Provisional Patent Application No. 60/868,134, filed on Dec. 1, 2006, entitled "LIGHTING DEVICE AND LIGHTING METHOD" (inventors: Gerald H. Negley and Antony Paul van de Ven). The disclosures of each of the above-referenced applications are hereby incorporated by reference in their entireties.

FIELD OF THE INVENTION

The present invention relates to solid state lighting, and more particularly to solid state lighting systems for general illumination.

BACKGROUND

Solid state lighting devices are used for a number of lighting applications. For example, solid state lighting assemblies including arrays of solid state lighting devices have been used as direct illumination sources, for example, in architectural and/or accent lighting. A solid state lighting device may include, for example, a packaged light emitting device including one or more light emitting diode (LED) devices, such as LED chips. Inorganic LEDs typically include semiconductor layers forming p-n junctions. Organic LEDs (OLEDs), which include organic light emission layers, are another type of solid state light emitting device. Quantum dot LEDs are also being investigated for use in solid state lighting applications. A quantum dot LED includes nanoscale semiconductor crystals that are capable of generating narrowband light in response to applied current. The optical properties of quantum dots are based on quantum confinement that occurs due to their small size. Thus, the bandgap and emission color of quantum dots can be tuned by simply changing the particle size to provide a wide color gamut. Furthermore, quantum dots may be capable of achieving high internal quantum efficiency.

Typically, a solid state light emitting device generates light through the recombination of electronic carriers, i.e. electrons and holes, in a light emitting layer or region. LED devices, or dice, can be mounted in many different ways for many different applications. For example, an LED device can be mounted on a header and enclosed by an encapsulant for protection, wavelength conversion, focusing, dispersion/scattering, etc. LED devices can also be mounted directly to a submount, such as a PCB, and can be coated directly with a phosphor, such as by electrophoresis or other techniques. Accordingly, as used herein, the term "light emitting diode" or "LED" can refer to an organic, inorganic or quantum dot LED device, including an inorganic LED device coated or otherwise provided with phosphor, or to a packaged device, such as a packaged device that includes an LED and that provides electrical contacts, primary optics, heat dissipation, and/or other functional features for the LED.

Solid state lighting assemblies are commonly used as backlights for small liquid crystal display (LCD) display screens, such as LCD display screens used in portable electronic devices. In addition, there has been increased interest in the use of solid state lighting assemblies for general illumination, such as indoor or outdoor lighting. For such applications, it is generally desired for the lighting device to generate white light having a high color rendering index (CRI), so that objects illuminated by the lighting device will appear to have more natural coloring. In contrast, light that has a low CRI may cause illuminated objects to have a washed out or unnatural appearance.

For larger illumination applications, multiple solid state lighting assemblies, such as lighting panels, may be connected together, for example, in a one or two dimensional array, to form a lighting system. Unfortunately, however, the hue of white light generated by the lighting system may vary from panel to panel, and/or even from lighting device to lighting device. Such variations may result from a number of factors, including variations of intensity of emission from different LEDs, and/or variations in placement of LEDs in a lighting device and/or on a panel. Accordingly, in order to construct a multi-panel lighting system that produces a consistent hue of white light from panel to panel, it may be desirable to measure the hue and saturation, or chromaticity, of light generated by a large number of panels, and to select a subset of panels having a relatively close chromaticity for use in the multi-panel lighting system. This may result in decreased yields and/or increased inventory costs for a manufacturing process.

Moreover, even if a solid state lighting assembly has a consistent, desired hue of light when it is first manufactured, the hue and/or brightness of solid state devices within the assembly may vary non-uniformly over time and/or as a result of temperature variations, which may cause the overall color point of a lighting system made up of the assemblies to change over time and/or may result in non-uniformity of color across the lighting panel. In addition, a user may wish to change the light output characteristics of a lighting assembly in order to provide a desired hue and/or brightness level.

Solid state lighting sources may have a number of advantages over conventional lighting sources for general illumination. For example, a conventional incandescent spotlight may include a 150 watt lamp projecting light from a 30 square inch aperture. Thus, the source may dissipate about 5 watts of power per square inch. Such sources may have a luminous efficacy of no more than about 10 lumens per watt, which means that in terms of ability to generate light in a given area, such a source may generate about 50 lumens per square inch in a relatively small space.

A conventional incandescent spotlight provides a relatively bright, highly directed source of light. However, an incandescent spotlight may illuminate only a small area. Thus, even though an incandescent spotlight has a relatively high light output, it may not be suitable for general illumination, for example illumination of a room. Thus, when used indoors, spotlights are typically reserved for accent or fill-in lighting applications.

Fluorescent light bulbs, on the other hand, produce light in a manner that is more suitable for general illumination. Fluorescent light bulbs approximate line sources of light, for which the illuminance falls off in proportion to 1/r near the source, where r is the distance from the source. Furthermore, fluorescent light sources are typically grouped in a panel to approximate a plane source of light, which may be more useful for general illumination and/or other purposes, since the intensity of the light generated by a plane source may not drop off as quickly near the source as the intensity of a point or line source of light does.

The distributed nature of a fluorescent light panel and its suitability for illumination has made fluorescent light panels a popular choice for general lighting applications. However, fluorescent light may appear slightly bluish and/or may have poor color rendering characteristics. Furthermore, fluorescent light bulbs may present environmental difficulties, since they may include mercury as a component.

SUMMARY

A solid state lighting apparatus includes a plurality of light emitting diodes (LEDs). Each of the LEDs includes an LED device configured to emit light having about a first dominant wavelength and a phosphor configured to receive at least some of the light emitted by the LED device and responsively emit light having about a second dominant wavelength. A combined light emitted by the LED device and the phosphor of a first one of the plurality of LEDs has a first color point and a combined light emitted by the LED device and the phosphor of a second one of the plurality of LEDs has a second color point that falls outside a seven step Macadam ellipse centered around the first color point.

The first color point and the second color point each fall within a defined area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

A chromaticity of combined light emitted by the plurality of LEDs has a color point that falls outside a ten-step Macadam ellipse around any point on the planckian locus between 2000 Kelvin and 8000 Kelvin, and in particular may fall within the defined area on a 1931 CIE Chromaticity Diagram.

The solid state lighting apparatus may further include a constant current source. The plurality of LEDs may be coupled to the constant current source and may receive a constant current supplied by the constant current source.

The defined area on a 1931 CIE Chromaticity Diagram may include a plurality of bins, each of the plurality of bins having approximately a size of a seven step Macadam ellipse. The first color point may fall in a first one of the plurality of bins and the second color point may fall within a second one of the plurality of bins.

In some embodiments, the first dominant wavelength may be from about 430 nm to about 480 nm, and in some embodiments from about 450 nm to about 460 nm. In other embodiments, the first dominant wavelength may be from about 500 nm to about 530 nm. The second dominant wavelength may be from about 600 nm to about 630 nm in some embodiments, and in some other embodiments, the second dominant wavelength may be from about 550 nm to about 580 nm.

The apparatus may further include a second plurality of LEDs, each of the second LEDs including an LED device configured to emit light having a third dominant wavelength and a phosphor configured to receive at least some of the light emitted by the LED device and responsively emit light having a fourth dominant wavelength. In some embodiments, the fourth dominant wavelength may be at least about 25 nm higher than the second dominant wavelength. A combined light emitted by the LED device and the phosphor of a first one of the second plurality of LEDs has a third color point and a combined light emitted by the LED device and the phosphor of a second one of the second plurality of LEDs has a fourth color point that falls outside a seven step Macadam ellipse centered around the third color point.

In some embodiments, the first dominant wavelength may be from about 430 nm to about 480 nm (and in some embodiments from about 450 nm to about 460 nm), the second dominant wavelength may be from about 550 nm to about 580 nm, the third dominant wavelength may be from about 430 nm to about 480 nm (and in some embodiments from about 450 nm to about 460 nm), and the fourth dominant wavelength may be from about 600 nm to about 630 nm. In some embodiments, the third dominant wavelength may be from about 500 nm to about 530 nm.

The solid state lighting apparatus may further include a first constant current source, and the plurality of LEDs may be coupled to the first constant current source and may receive a constant current supplied by the first constant current source. The apparatus may further include a second constant current source, and the second plurality of LEDs may be coupled to the second constant current source and may receive a constant current supplied by the second constant current source.

A line segment on a 1931 CIE Chromaticity diagram between a color point of combined light emitted by the first plurality of LEDs the color point of light emitted by the second plurality of LEDs may cross the planckian locus between about 2500 Kelvin and 4500 Kelvin.

The plurality of LEDs may include a first plurality of LEDs, and the apparatus may further include a second plurality of LEDs. Each of the second LEDs may include an LED device configured to emit light having a third dominant wavelength that is from about 600 nm to about 630 nm.

A line segment on a 1931 CIE Chromaticity diagram between a color point of combined light emitted by the first plurality of LEDs the color point of light emitted by the second plurality of LEDs may cross the planckian locus between about 2500 Kelvin and 4500 Kelvin.

A solid state lighting apparatus according to some embodiments includes a current source, and a string of light emitting diodes (LEDs) connected to the current source and configured to emit light in response to a drive current supplied by the current source. Each of the LEDs in the string includes an LED device configured to emit light having a first dominant wavelength and a phosphor configured to receive at least some of the light emitted by the LED device and responsively emit light having about a dominant wavelength that is different from the first dominant wavelength. A combined light emitted by the LED device and the phosphor of a first one of the plurality of LEDs has a first color point and a combined light emitted by the LED device and the phosphor of a second one of the plurality of LEDs has a second color point that falls outside a seven step Macadam ellipse around the first color point.

The first color point and the second color point may each fall within a defined area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

A chromaticity of combined light emitted by the plurality of LEDs has a color point that falls outside a ten-step MacAdam ellipse around any point on the planckian locus between 2000 Kelvin and 8000 Kelvin, and in particular may fall within the defined area on a 1931 CIE Chromaticity Diagram.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIGS. 4A and 4B illustrate a solid state lighting apparatus according to some embodiments.

DETAILED DESCRIPTION

Figure 1:
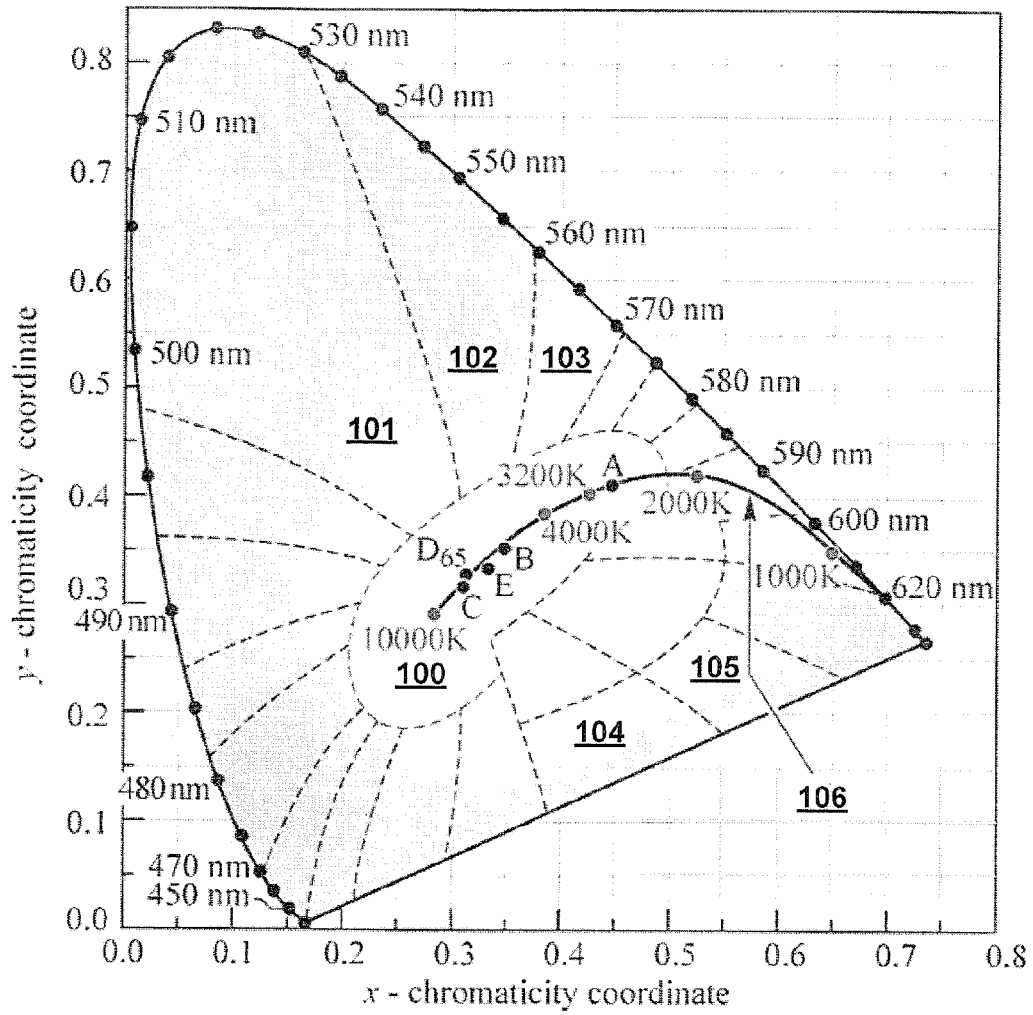
FIG. 1 is a graph of a 1931 CIE Chromaticity Diagram illustrating the location of the planckian locus.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "front" or "back" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Visible light may include light having many different wavelengths. The apparent color of visible light can be illustrated with reference to a two dimensional chromaticity diagram, such as the 1931 CIE Chromaticity Diagram illustrated in FIG. 1, and the 1976 CIE u'v' Chromaticity Diagram, which is similar to the 1931 Diagram but is modified such that similar distances on the 1976 u'v' CIE Chromaticity Diagram represent similar perceived differences in color. These diagrams provide useful reference for defining colors as weighted sums of colors.

In a CIE-u'v' chromaticity diagram, such as the 1976 CIE Chromaticity Diagram, chromaticity values are plotted using scaled u- and v-parameters which take into account differences in human visual perception. That is, the human visual system is more responsive to certain wavelengths than others. For example, the human visual system is more responsive green light than red light. The 1976 CIE-u'v' Chromaticity Diagram is scaled such that the mathematical distance from one chromaticity point to another chromaticity point on the diagram is proportional to the difference in color perceived by a human observer between the two chromaticity points. A chromaticity diagram in which the mathematical distance from one chromaticity point to another chromaticity point on the diagram is proportional to the difference in color perceived by a human observer between the two chromaticity points may be referred to as a perceptual chromaticity space. In contrast, in a non-perceptual chromaticity diagram, such as the 1931 CIE Chromaticity Diagram, two colors that are not distinguishably different may be located farther apart on the graph than two colors that are distinguishably different.

As shown in FIG. 1, colors on a 1931 CIE Chromaticity Diagram are defined by x and y coordinates (i.e., chromaticity coordinates, or color points) that fall within a generally U-shaped area. Colors on or near the outside of the area are saturated colors composed of light having a single wavelength, or a very small wavelength distribution. Colors on the interior of the area are unsaturated colors that are composed of a mixture of different wavelengths. White light, which can be a mixture of many different wavelengths, is generally found near the middle of the diagram, in the region labeled 100 in FIG. 1. There are many different hues of light that may be considered "white," as evidenced by the size of the region 100. For example, some "white" light, such as light generated by sodium vapor lighting devices, may appear yellowish in color, while other "white" light, such as light generated by some fluorescent lighting devices, may appear more bluish in color.

Light that generally appears green is plotted in the regions 101, 102 and 103 that are above the white region 100, while light below the white region 100 generally appears pink, purple or magenta. For example, light plotted in regions 104 and 105 of FIG. 1 generally appears magenta (i.e., red-purple or purplish red).

It is further known that a binary combination of light from two different light sources may appear to have a different color than either of the two constituent colors. The color of the combined light may depend on the relative intensities of the two light sources. For example, light emitted by a combination of a blue source and a red source may appear purple or magenta to an observer. Similarly, light emitted by a combination of a blue source and a yellow source may appear white to an observer.

Also illustrated in FIG. 1 is the planckian locus 106, which corresponds to the location of color points of light emitted by a black-body radiator that is heated to various temperatures. In particular, FIG. 1 includes temperature listings along the black-body locus. These temperature listings show the color path of light emitted by a black-body radiator that is heated to such temperatures. As a heated object becomes incandescent, it first glows reddish, then yellowish, then white, and finally bluish, as the wavelength associated with the peak radiation of the black-body radiator becomes progressively shorter with increased temperature. Illuminants which produce light which is on or near the black-body locus can thus be described in terms of their correlated color temperature (CCT).

The chromaticity of a particular light source may be referred to as the "color point" of the source. For a white light source, the chromaticity may be referred to as the "white point" of the source. As noted above, the white point of a white light source may fall along the planckian locus. Accordingly, a white point may be identified by a correlated color temperature (CCT) of the light source. White light typically has a CCT of between about 2000 K and 8000 K. White light with a CCT of 4000 may appear yellowish in color, while light with a CCT of 8000 K may appear more bluish in color. Color coordinates that lie on or near the black-body locus at a color temperature between about 2500 K and 6000 K may yield pleasing white light to a human observer.

"White" light also includes light that is near, but not directly on the planckian locus. A Macadam ellipse can be used on a 1931 CIE Chromaticity Diagram to identify color points that are so closely related that they appear the same, or substantially similar, to a human observer. A Macadam ellipse is a closed region around a center point in a two-dimensional chromaticity space, such as the 1931 CIE Chromaticity Diagram, that encompasses all points that are visually indistinguishable from the center point. A seven-step Macadam ellipse captures points that are indistinguishable to an ordinary observer within seven standard deviations, a ten step Macadam ellipse captures points that are indistinguishable to an ordinary observer within ten standard deviations, and so on. Accordingly, light having a color point that is within about a ten step Macadam ellipse of a point on the planckian locus may be considered to have the same color as the point on the planckian locus.

The ability of a light source to accurately reproduce color in illuminated objects is typically characterized using the color rendering index (CRI). In particular, CRI is a relative measurement of how the color rendering properties of an illumination system compare to those of a black-body radiator. The CRI equals 100 if the color coordinates of a set of test colors being illuminated by the illumination system are the same as the coordinates of the same test colors being irradiated by the black-body radiator. Daylight has the highest CRI (of 100), with incandescent bulbs being relatively close (about 95), and fluorescent lighting being less accurate (70-85).

For backlight and illumination applications, it is often desirable to provide a lighting source that generates white light having a high color rendering index, so that objects illuminated by the lighting source may appear more natural. Accordingly, such lighting sources may typically include an array of solid state lighting devices including red, green and blue light emitting devices. When red, green and blue light emitting devices are energized simultaneously, the resulting combined light may appear white, or nearly white, depending on the relative intensities of the red, green and blue sources. However, even light that is a combination of red, green and blue emitters may have a low CRI, particularly if the emitters generate saturated light, because such light may lack contributions from many visible wavelengths.

Furthermore, it may increase the complexity of drive circuits of a solid state lighting device to incorporate red emitting light emitting diodes in a solid state lighting device in an effort to obtain a desired CCT. Red LEDs typically include AlInGaP active layers, which may have different thermal characteristics from other LEDs in the device, such as InGaN-based blue LEDs. To maintain a relatively constant color point in different thermal regimes, it may be beneficial to take into account these different in thermal characteristics of the light sources by altering the drive current to the LEDs, thereby increasing the complexity of the solid state lighting device.

A solid state lighting device according to some embodiments includes a plurality of light emitting diodes (LEDs) including at least a first LED and a second LED. Chromaticities of the first and second LEDs are selected so that a combined light generated by a mixture of light from the pair of LEDs has about a target chromaticity, which may for example be white. In some embodiments, the first LED includes a first LED device that emits light in the blue portion of the visible spectrum and includes a phosphor, such as a red phosphor, that is configured to receive at least some of the light emitted by the blue LED device and responsively emit red light. In particular embodiments, the first LED device may have a dominant wavelength from about 430 nm to about 480 nm, and the phosphor may emit light having a dominant wavelength from about 600 nm to about 630 nm in response to light emitted by the first LED device.

The second LED emits light having a color point that lies above the planckian locus of a 1931 CIE Chromaticity diagram, for example, in a green, yellowish green or green-yellow portion of the 1931 CIE Chromaticity Diagram, as explained in more detail below.

The color point of the second LED may be outside a 10-step Macadam ellipse from any point on the planckian locus. Accordingly, the light emitted by the second LED may not be generally regarded as white light, but may be more green or greenish-yellow in appearance.

In some embodiments, the second LED may include an LED device that emits substantially saturated light having a dominant wavelength between about 500 nm and 565 nm, i.e., a green LED. In other embodiments, the second LED may include an LED device/phosphor combination that emits unsaturated, non-white light that is, for example, green-yellow in appearance.

The first LED device, the phosphor, and the second LED may have respective color points selected so that a line segment on the 1931 CIE Chromaticity diagram between a first color point of combined light emitted by the first LED and the phosphor and a second color point of light emitted by the second LED crosses the planckian locus at a point that is between about 2500 K and 4500 K. By adjusting relative intensities of the first and second LEDs, a color point near the planckian locus between about 2500 K and 4500 K may be desirably output by a combination of light from the first LED, the phosphor and the second LED.

In some embodiments, the second LED may include a second LED device that emits substantially saturated light in the blue portion of the visible spectrum and may include a second phosphor that is configured to receive light emitted by the second LED device and to emit yellow light in response to the light emitted by the second LED device. Accordingly, in some embodiments, both the first LED and the second LED may include blue emitting LEDs.

In still further embodiments, the first LED may include a first LED device that emits substantially saturated light in the green portion of the visible spectrum (i.e., from about 500 nm to about 550 nm) and may include a first phosphor that is configured to receive light emitted by the first LED device and to emit red light in response the green light emitted by the first LED device. A combined light emitted by the first LED device and the first phosphor may fall below the planckian locus. In some embodiments, the first LED device may emit substantially saturated light having a dominant wavelength between about 500 nm to about 530 nm, and the first phosphor may emit light having a dominant wavelength from about 600 nm to about 630 nm in response to light emitted by the first LED.

The second LED may include a second LED device that emits substantially saturated light in the green portion of the visible spectrum and may include a second phosphor that is configured to receive light emitted by the second LED device and to emit yellow light in response the green light emitted by the second LED device, wherein a combined light emitted by the second LED device and the second phosphor has a color point above the planckian locus. Accordingly, in some embodiments, both the first LED device and the second LED device may include green emitting LEDs. That is, combining a green emitting LED device with a red phosphor can result in light having a color point that falls above or below the planckian locus depending on the amount of red phosphor used. Combining a green LED with a red phosphor may have greater luminous efficacy than a combination of a blue LED with red phosphor due to reduced Stokes loss of the green to red conversion versus a blue to yellow conversion as a percentage of wavelength.

Such a device (i.e. including a first green LED combined with red phosphor and a second green LED combined with a yellow phosphor), may have high luminous efficacy, but may suffer from low CRI. As noted, the high luminous efficacy may result from lower Stokes losses.

In other embodiments, the second LED may include a second LED device that emits substantially saturated light in the blue portion of the visible spectrum (e.g., about 430 nm to about 480 nm dominant wavelength) and includes a second phosphor that is configured to receive light emitted by the second LED device and to emit yellow light in response the blue light emitted by the second LED device. Accordingly, in some embodiments, the first LED may include a green emitting LED device combined with a red phosphor while the second LED may include a blue emitting LED device combined with a yellow phosphor. Such a device may have both excellent color rendering characteristics and good luminous efficacy.

In still further embodiments, the second LED may emit substantially saturated blue (430 nm to 480 nm dominant wavelength) and/or cyan (480 nm to 500 nm dominant wavelength) light that, when combined with light from the first LED (including a green LED combined with a red phosphor), appears white. Such a combination may generate white light having good color rendering characteristics and excellent luminous efficacy.

The first LED device, the phosphor, and the second LED may have respective color points selected so that a line segment on the 1931 CIE Chromaticity diagram between a first color point of combined light emitted by the first LED device and the phosphor and a second color point of light emitted by the second LED crosses the planckian locus at a point that is between about 2500 K and 4500 K. By adjusting relative intensities of the first and second LEDs, a color point near the planckian locus between about 2500 K and 4500 K may be desirably output by a combination of light from the first LED device, the phosphor and the second LED.

Figure 2:
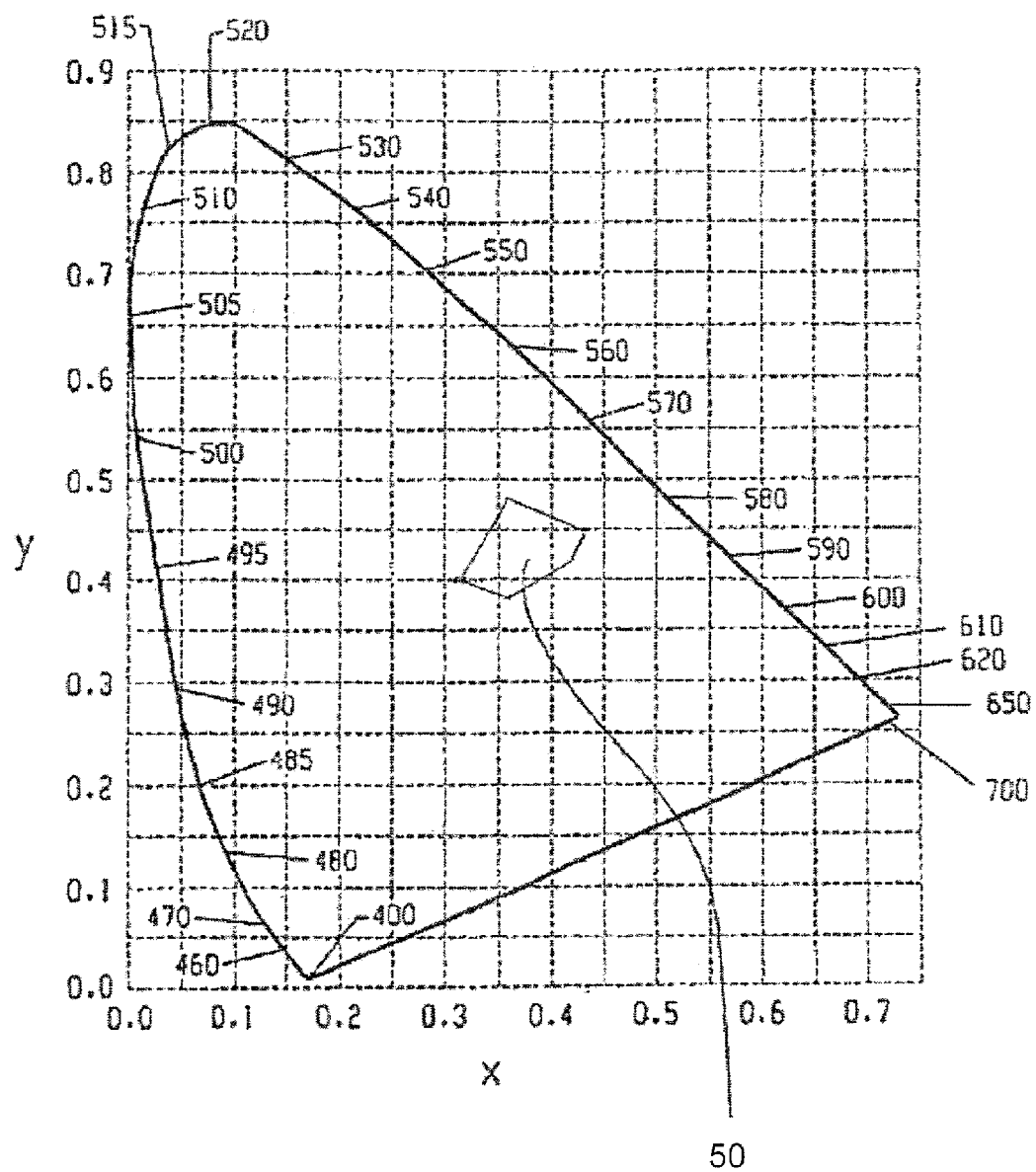
FIG. 2 is a graph of a 1931 CIE Chromaticity Diagram on which a chromaticity region above the planckian locus is illustrated.

In some embodiments, the device may include LED/phosphor combinations as described in U.S. Pat. No. 7,213,940, issued May 8, 2007, and entitled "LIGHTING DEVICE AND LIGHTING METHOD," the disclosure of which is incorporated herein by reference. As described therein, a lighting device may include solid state light emitters (i.e., LED devices) which emit light having dominant wavelength in ranges of from 430 nm to 480 nm, and a group of phosphors which emit light having dominant wavelength in the range of from 555 nm to 585 nm. A combination of light by the first group of emitters, and light emitted by the group of phosphors produces a sub-mixture of light having x, y color coordinates within a defined area on a 1931 CIE Chromaticity Diagram that is referred to herein as "blue-shifted yellow" or "BSY," illustrated as region 50 in the 1931 CIE Chromaticity Diagram shown in FIG. 2. Such non-white light may, when combined with light having a dominant wavelength from 600 nm to 630 nm, produce warm white light.

Furthermore, as described herein, BSY light may, when combined with light in the magenta to red-purple region of the 1931 CIE Chromaticity diagram, produce warm white light having high luminous efficacy and/or high CRI.

Accordingly, in some embodiments, a combined light emitted by the second LED device and the second phosphor would, in an absence of any additional light, produce a sub-mixture of light having x, y color coordinates which define a point which may be within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

The solid state lighting device may further include a third LED device that emits light in the blue or green portion of the visible spectrum and that has a dominant wavelength that may be at least about 10 nm greater than a dominant wavelength of the first LED device. That is, a third LED device may be provided that may "fill in" some of the spectral gaps that may be present in light emitted by the lighting device, to thereby improve the CRI of the device. The third LED device may have a dominant wavelength that may be at least about 20 nm greater, and in some embodiments about 50 nm or more greater, than the dominant wavelength of the first LED device.

Figure 3:
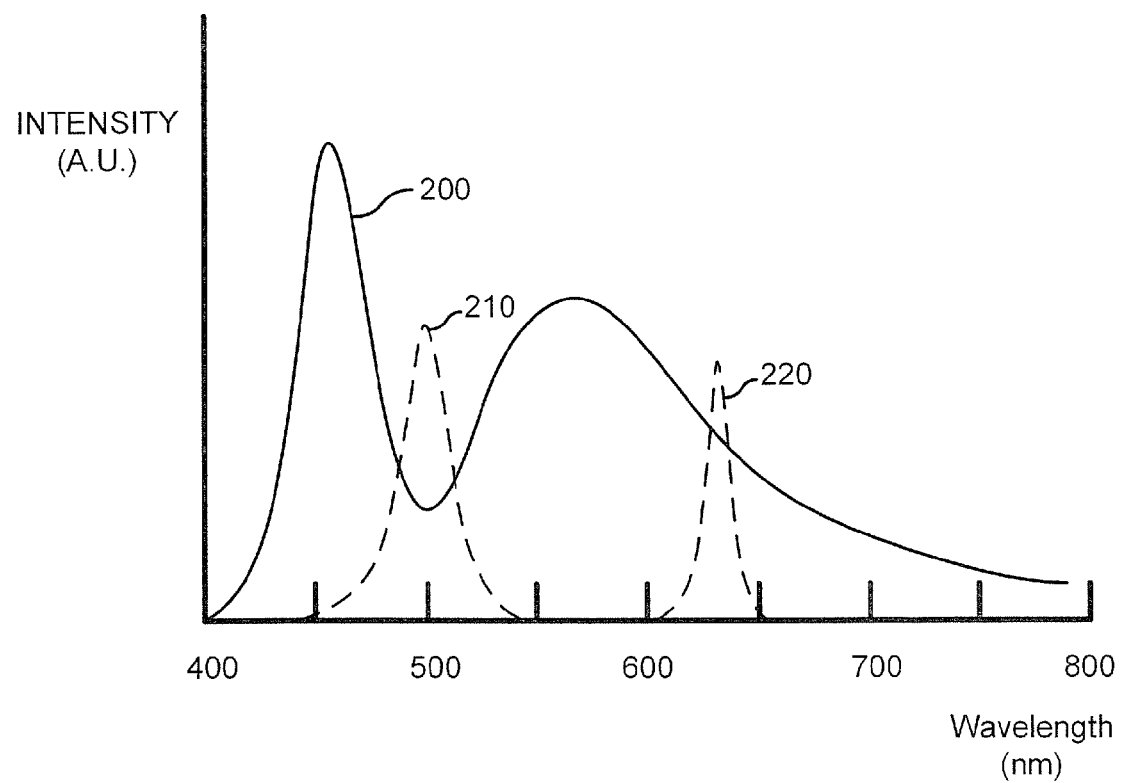
FIG. 3 is a graph of a spectral distribution of a solid state lighting device.

For example, FIG. 3 illustrates a spectrum 200 (intensity vs. wavelength) of light emitted by a blue LED device and a yellow phosphor. The spectrum 200 includes a narrow peak at around 450 nm that represents light emitted by a blue LED and a broad peak centered around 550-560 nm that represents light emitted by a yellow phosphor, such as YAG:Ce, in response to light emitted by the blue LED. A green LED having a dominant wavelength of about 500 nm and an emission spectrum 210 may be provided in addition to the blue LED to provide additional spectral energy in the gap between the blue emission peak and the yellow emission peak.

In some further embodiments, the solid state lighting device may further include yet another LED device that emits light in the red portion of the visible spectrum. The red LED device may further fill in spectral gaps in the spectrum of light emitted by the device, which may further improve CRI. For example, as further shown in FIG. 3, a red LED device having a dominant wavelength of about 630 nm and an emission spectrum 220 may provide additional spectral energy in the tail of the yellow emission peak. It will be appreciated that the spectral distributions illustrated in FIG. 3 are representative graphs for illustration only, and do not represent actual or simulated data.

Some embodiments provide an illumination module that can achieve high color uniformity, high color rendering (CRI), improved thermal stability, and/or high luminous efficacy.

Referring to FIGS. 4A and 4B, a lighting apparatus 110 according to some embodiments is illustrated. The lighting apparatus 110 shown in FIGS. 4A and 4B is a "can" lighting fixture that may be suitable for use in general illumination applications as a down light or spot light. However, it will be appreciated that a lighting apparatus according to some embodiments may have a different form factor. For example, a lighting apparatus according to some embodiments can have the shape of a conventional light bulb, a pan or tray light, an automotive headlamp, or any other suitable form.

The lighting apparatus 110 generally includes a can shaped outer housing 112 in which a lighting panel 120 is arranged. In the embodiments illustrated in FIGS. 4A and 4B, the lighting panel 120 has a generally circular shape so as to fit within an interior of the cylindrical housing 112. Light is generated by solid state lighting devices (LEDs) 24A, 24B, which are mounted on the lighting panel 120, and which are arranged to emit light 115 towards a diffusing lens 114 mounted at the end of the housing 112. Diffused light 117 is emitted through the lens 114. In some embodiments, the lens 114 may not diffuse the emitted light 115, but may redirect and/or focus the emitted light 115 in a desired near-field or far-field pattern.

Still referring to FIGS. 4A and 4B, the solid-state lighting apparatus 110 may include a plurality of first LEDs 24A and a plurality of second LEDs 24B. In some embodiments, the plurality of first LEDs 24A may include white emitting, or non-white emitting, light emitting devices. The plurality of second LEDs 24B may include light emitting devices that emit light having a different dominant wavelength from the first LEDs 24A, so that combined light emitted by the first LEDs 24A and the second LEDs 24B may have a desired color and/or spectral content.

For example, the combined light emitted by the plurality of first LEDs 24A and the plurality of second LEDs 24B may be warm white light that has a high color rendering index.

Blue and/or green LED devices used in a lighting apparatus according to some embodiments may be InGaN-based blue and/or green LED devices available from Cree, Inc., the assignee of the present invention. For example, the LED devices may include EZBRIGHT® power chips manufactured by Cree, Inc. EZBRIGHT® power chips have been demonstrated with an external quantum efficiency (i.e., the product of internal quantum efficiency and light extraction efficiency) as high as 50% at 50 A/cm$^2$ corresponding to greater than 450 mW of optical output power at 350 mA drive current. Red LEDs used in the lighting apparatus may be, for example, AlInGaP LED devices available from Epistar, Osram and others.

In some embodiments, the LED devices in the LEDs 24A, 24B may have a square or rectangular periphery with an edge length of about 900 µm or greater (i.e. so-called "power chips.") However, in other embodiments, the LED devices 24A, 24B may have an edge length of 500 µm or less (i.e. so-called "small chips"). In particular, small LED devices may operate with better electrical conversion efficiency than power chips. For example, green LED devices with a maximum edge dimension less than 500 microns and as small as 260 microns, commonly have a higher electrical conversion efficiency than 900 micron chips, and are known to typically produce 55 lumens of luminous flux per Watt of dissipated electrical power and as much as 90 lumens of luminous flux per Watt of dissipated electrical power.

Figure 4C:
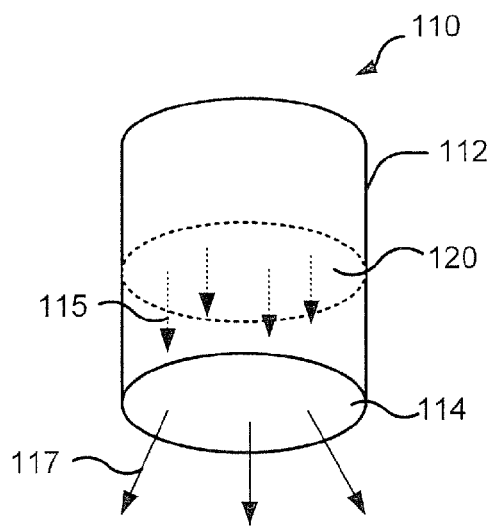
FIG. 4C is a cross-sectional view of a packaged light emitting diode according to some embodiments.
Figure 4C:
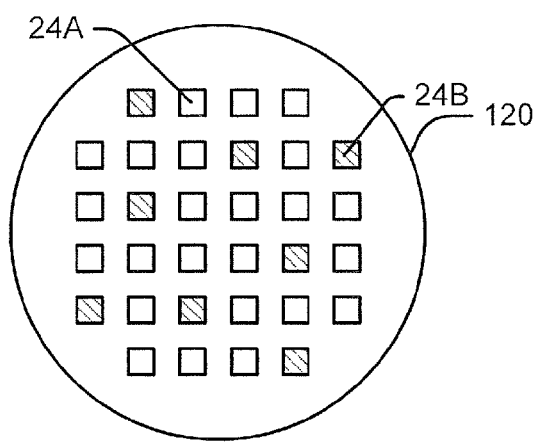
Figure 4C:
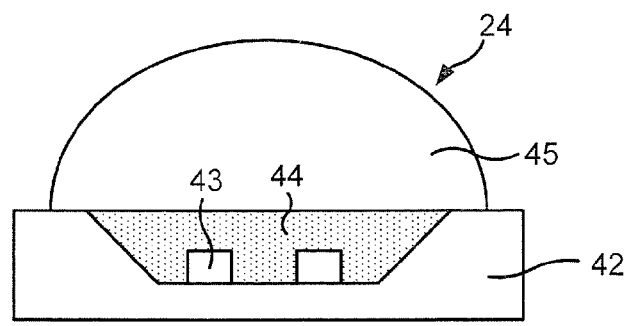

FIG. 4C is a cross-sectional view of a packaged light emitting diode 24 according to some embodiments. According to some embodiments, a packaged LED 24 includes a submount 42 on which one or more LED devices 43 are mounted. The submount 42 can include electrical traces, wirebond pads, leads, and/or other features that permit the LED devices 43 to be mounted thereon and electrically activated. The submount 42 can also include a heat sink (not shown). An optical encapsulant 44 may surround and protect the LED devices 43 within a cavity defined in, on or by the submount 42. The encapsulant material 44 may enhance coupling of light emission out of the LED devices 43 for better extraction from the package. An optional lens 45 may be mounted on the submount 42 above the LED devices 43 to provide a desired near or far field emission pattern from the package.

One or more phosphor materials can be provided within the package to convert some or all light emitted by one or more of the LED devices 43. For example, in some embodiments, a phosphor can be coated or otherwise provided on one or more of the LED devices 43, can be suspended within the encapsulant material 44, or may be coated on or mixed into the material of the lens 45. In some embodiments, a layer of phosphor bearing material can be provided between the encapsulant material 44 and the lens 45, and in some embodiments can be provided as a layer of single crystal phosphor material that is arranged to receive at least some light emitted by the LED devices 43.

Figure 5:
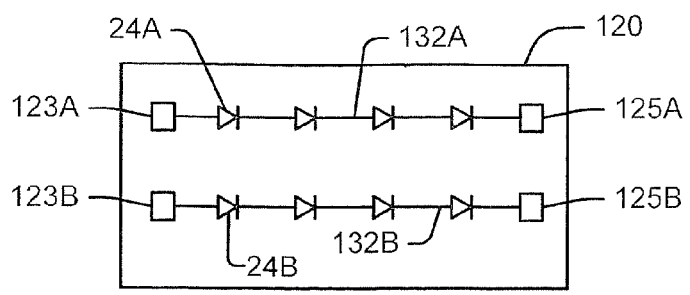
FIG. 5 is a circuit diagram illustrating interconnection of LEDs in a solid state lighting apparatus according to some embodiments.

The LEDs 24A, 24B in the lighting apparatus 110 may be electrically interconnected in respective strings, as illustrated in the schematic circuit diagram in FIG. 5. As shown therein, the LEDs 24A, 24B may be interconnected such that the LEDs 24A are connected in series to form a first string 132A. Likewise, the LEDs 24B may be arranged in series to form a second string 132B. Each string 132A, 132B may be connected to a respective anode terminal 123A, 125A and a cathode terminal 123B, 125B.

Although two strings 132A, 132B are illustrated in FIG. 5, it will be appreciated that the lighting apparatus 110 may include more or fewer strings. Furthermore, there may be multiple strings of LEDs 24A, and multiple strings of other colored LEDs 24B.

In order to achieve warm white emission, conventional packaged LEDs include either a single component orange phosphor in combination with a blue LED device or a mixture of yellow/green and orange/red phosphors in combination with a blue LED device. However, using a single component orange phosphor can result in a low CRI as a result of the absence of greenish and reddish hues. On the other hand, red phosphors are typically much less efficient than yellow phosphors, and may reabsorb light emitted by the yellow phosphors. Therefore, the addition of red phosphor in yellow phosphor can reduce the efficiency of the package, which can result in poor luminous efficacy. Luminous efficacy is a measure of the proportion of the energy supplied to a lamp that is converted into light energy. It is calculated by dividing the lamp's luminous flux, measured in lumens, by the power consumption, measured in watts. Furthermore, mixing red and yellow phosphors can result in loss of efficiency, because the excitation band of the red phosphors may overlap with the emission spectrum of the yellow phosphors, which means that some light emitted by the yellow phosphors may get re-absorbed by the red phosphors.

Accordingly, in some embodiments, there may be magenta, or blue shifted red (BSR) emitting phosphor based LEDs 24A and green-yellow, BSY or green emitters 24B provided as physically separate emitters on a PCB 120. A magenta emitting phosphor enhanced LED can include, for example, a blue LED device coated or otherwise combined with a red phosphor. The magenta light emitted by a blue LED device coated or otherwise combined with red phosphor can combine, for example, with green light emitted by a green LED device or green-yellow light (e.g., Blue Shifted Yellow, or BSY) to produce warm white light having a high CRI (e.g., greater than 95) with a high luminous efficacy (lm/W). Such a combination can be particularly useful, as InGaN-based green LEDs can have relatively high efficiency. Furthermore, the human eye is most sensitive to light in the green portion of the spectrum. Thus, although some efficiency can be lost due to the use of a red phosphor, the overall efficiency of the pair of LEDs can increase due to the increased efficiency of a green LED or a BSY LED, as discussed below.

The use of magenta LEDs (e.g., blue LED devices combined with red phosphor) in combination with green LEDs to produce white light can have surprising benefits. For example, systems using such LED combinations can have improved thermal-optical stability. In contrast, systems that include InGaN-based blue LEDs and AlInGaP-based red LEDs can have problems with thermal-optical stability, since the color of light emitted by AlInGaP-based LEDs can change more rapidly with temperature than the color of light emitted by InGaN-based LEDs. Thus, LED-based lighting assemblies that include InGaN-based blue LEDs and AlInGaP-based red LEDs are often provided with active compensation circuits that change the ratio of red to blue light emitted by the assembly as the operating temperature of the assembly changes, in an attempt to provide a stable color point over a range of temperatures.

In contrast, an assembly combining blue LED devices combined with red phosphor and green or BSY LEDs can have better thermal stability, possibly without requiring color-temperature compensation, because both the blue LED devices and the green LEDs can be InGaN-based devices that have similar responses to temperature variation. In some embodiments, color-temperature compensation can be provided, but the range of the temperature-induced color sweep can be reduced, thereby reducing the needed control authority in the compensation circuit and/or providing additional degrees of design freedom with potential benefits to color tolerancing and the binning scheme for the system.

In some embodiments, the blue LEDs can be combined with both red and yellow phosphors to generate non-white light (although, as explained above, the self-absorption of yellow light by the red phosphors can reduce the efficiency of the device). The non-white light generated by such an LED/phosphor combination can be combined with green light emitted by an InGaN-based green LED device to produce white light having high color rendering capabilities and improved thermal stability. The addition of yellow phosphor can improve the color rendering abilities of the device, since a yellow phosphor can produce light having a broad spectrum. Broad-spectrum light tends to provide better color rendering characteristics compared to light generated by sources having narrow emission peaks.

Providing LED devices with an efficient, saturated green emitter near 530 nm may be particularly important for LCD backlighting where the green light source can provide 50% or more of the illumination. Furthermore, a magenta/green LED combination can provide better overall system efficiency than a system that uses unsaturated light from fluorescent lamps (CCFL) or greenish white fluorescent LEDs. A pure green LED of equal efficiency at the same dominant wavelength as a greenish white LED can provide substantially greater front of screen (FOS) luminance than the greenish white LED because the illumination may pass through the filters much more efficiently.

Figure 6:
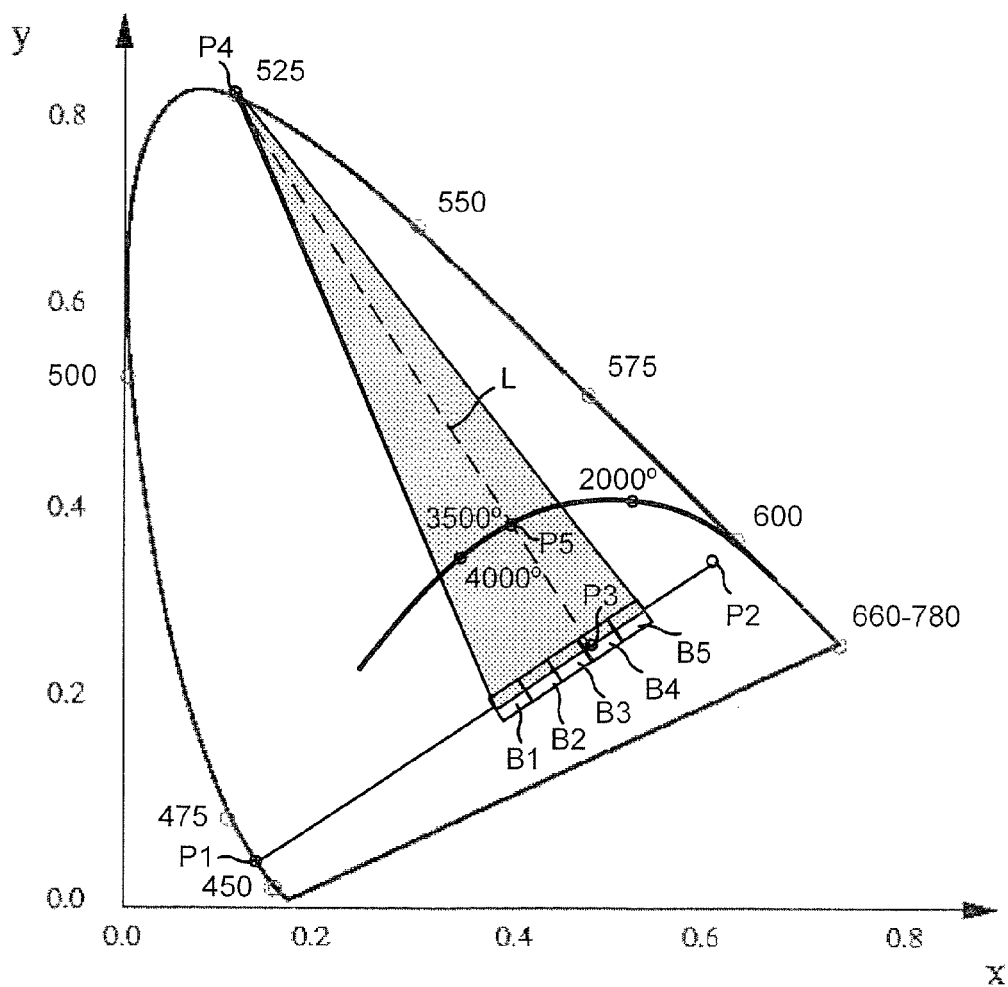
FIG. 6 is a 1931 CIE Chromaticity Diagram that illustrates combinations of LEDs in a lighting apparatus according to some embodiments.

FIG. 6, which is a 1931 CIE Chromaticity Diagram, illustrates the combination of magenta and green LEDs in a lighting device. As illustrated therein, a first LED is provided that emits light at a color point P1 having a dominant wavelength of about 400 nm to about 480 nm, in some embodiments from about 430 nm to about 480 nm in some embodiments about 450 nm to about 465 nm and in some embodiments about 460 nm. A red phosphor is configured to receive at least some light emitted by the blue LED and to responsively emit light at a color point P2 having a dominant wavelength of about 600 nm to about 630 nm. A combined light emitted by the blue LED and the red phosphor may have a color point P3 that falls into one of the bins B1-B5 illustrated in FIG. 6. The bins B1-B5 may be centered around respective color points that are separated from adjacent points by at least a seven step Macadam ellipse, and in some cases by at least a 10 step Macadam ellipse.

Suitable red phosphors include $CaAlSiN^3:Eu^{2+}$ and $Sr_2Si_5N_8:Eu^{2+}$. This phosphor can maintain a quantum efficiency greater than 80% at temperatures above 150° C. Other red phosphors that can be used include phosphors from the $Eu^{2+}$-SiAlON family of phosphors, as well as $CaSiN_2:Ce^{3+}$, $CaSiN_2:Eu^{2+}$ and/or phosphors from the $(Ca,Si,Ba)SiO_4$:$Eu^{2+}$, (BOSE) family. In particular, $CaAlSiN:Eu^{2+}$ phosphors available from Mitsubishi Chemical Company may have a dominant wavelength of about 624 nm, a peak wavelength of about 628 nm and a FWHM of about 100 nm.

Nitride phosphors are characterized by a broad excitation band. Overlap between the excitation band of one phosphor in a system and the emission spectrum of another phosphor in the system can result in photon re-absorption in systems that use mixed red/yellow phosphors, for example. In particular, most red nitride phosphors have an excitation bands that extend well over 500 nm. The re-absorption that can occur when mixing yellow-green and red phosphors can lead to significant losses, especially if the conversion efficiency of the phosphors is below 90%.

Accordingly, some embodiments employ multiple color phosphor conversion LEDs using temperature stable phosphors. A typical approach for generating warm white light is to combine red direct emission LEDs with a phosphor conversion yellow-green LED. The drawback of this approach is the temperature sensitivity of the red direct emission (i.e. non-phosphor based) LEDs, which requires complex drive circuitry to monitor and balance the output power of the red LED as the system heats up. Typical temperature operating levels necessary to generate the appropriate radiant flux for general illumination run at a junction temperature of 125° C. or greater. At these temperatures, another drawback, other than the decreased efficacy, is the large a large drift in CCT values of the light. The instability of the red LED or YAG phosphor leads to nearly a 400K CCT shift from room temperature to operating temperatures. Some embodiments that do not include direct (i.e. non phosphor based) emission of red light can avoid some or all of these problems.

The bins B1-B5 may fall in a region such as the red-purple or purplish red regions 104, 105 illustrated in FIG. 1. Light in such bins that is generated by a combination of blue LED and red phosphor is referred to herein generally as blue shifted red, or BSR, light.

In addition to the blue LED/red phosphor combination, a green LED having a color point P4 is provided. The color point P4 may be above the planckian locus and may be associated with substantially saturated light having a wavelength in the range of about 500 nm to about 550 nm, and in particular about 525 nm. The BSR light in bins B1-B5 is combined with the green light to produce white light having a color point P5 at a CCT between about 2000 K and 6000 K, and in particular between about 2500 K to about 4500 K. Thus, a line segment L on a 1931 CIE Chromaticity diagram between a color point P3 of combined light emitted by the first LED and the phosphor and the color point P4 of light emitted by the second LED may cross the planckian locus between about 2500 Kelvin and 4500 Kelvin.

Figure 7:
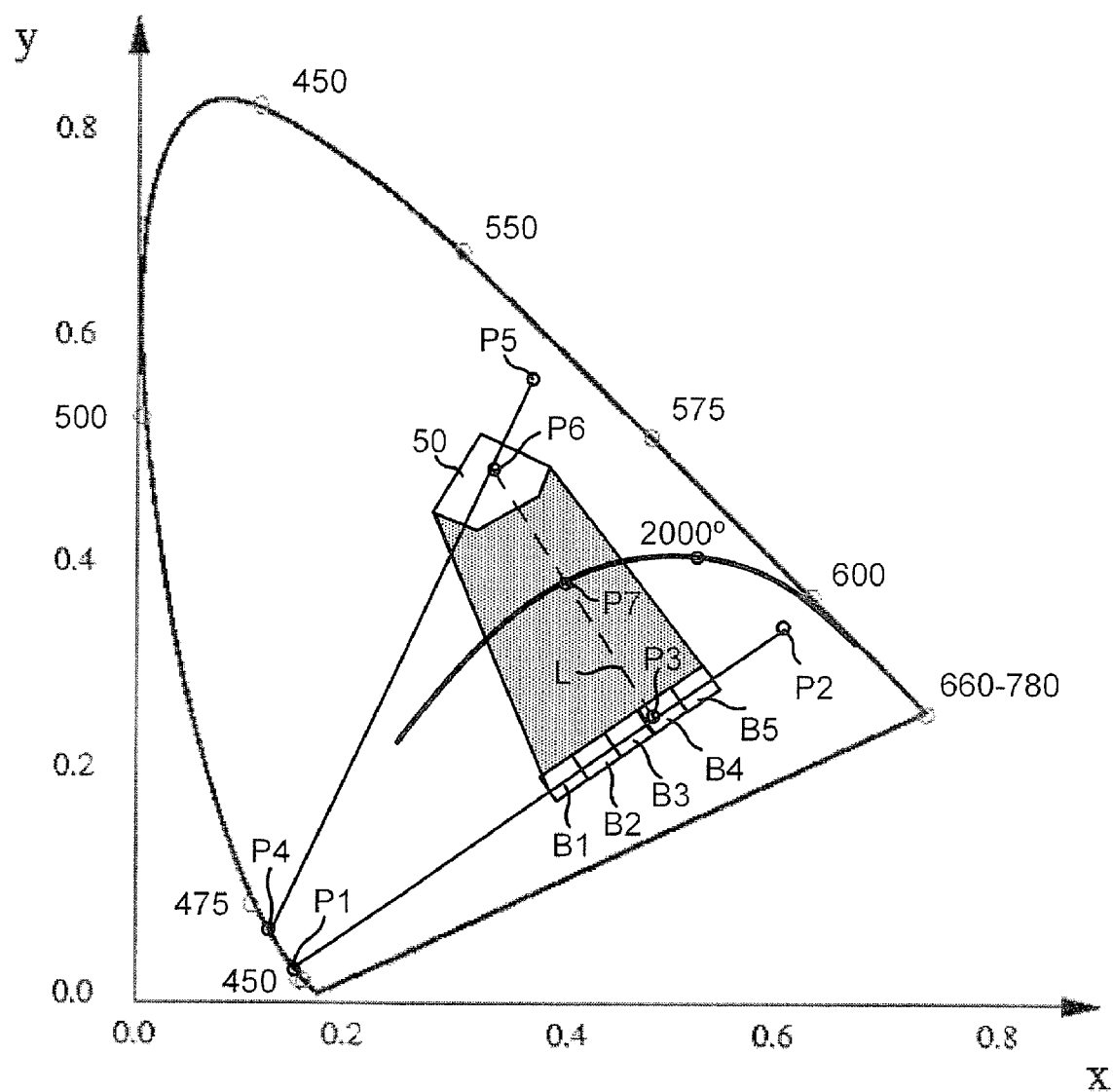
FIG. 7 is a 1931 CIE Chromaticity Diagram that illustrates combinations of LEDs in a lighting apparatus according to further embodiments.

FIG. 7 is a 1931 CIE Chromaticity Diagram that illustrates the combination of magenta and BSY LEDs in a lighting device. As illustrated therein, a first LED is provided that emits light at a color point P1 having a dominant wavelength of about 400 nm to about 480 nm, in some embodiments about 430 nm to about 480 nm, in some embodiments about 450 nm to about 460 nm, and in some embodiments about 450 nm. A red phosphor is configured to receive at least some light emitted by the blue LED and to responsively emit light at a color point P2 having a dominant wavelength of about 600 nm to about 630 nm. A combined light emitted by the blue LED and the red phosphor may comprise BSR light having a color point P3 that falls into one of the bins B1-B5 illustrated in FIG. 7. The bins B1-B5 may fall in a region such as the red-purple or purplish red regions 104, 105 illustrated in FIG. 1.

In addition to the blue LED/red phosphor combination, a BSY LED having a color point P6 within region 50 is provided. The color point P6 may therefore fall above the planckian locus. The BSR light may be generated by providing a blue LED having a dominant wavelength at a color point P4 of about 430 nm to about 480 nm, in some embodiments about 450 nm to about 465 nm, and in some embodiments about 460 nm in combination with a yellow-emitting phosphor that emits light at a color point P5 to produce the BSY light. Suitable yellow phosphors include $Y_3Al_5O_{12}:Ce^{3+}$ (Ce:YAG), $CaAlSiN_3:Ce^{3+}$, and phosphors from the $Eu^{2+}$-SiAlON-family, and/or the BOSE family. The phosphor may also be doped at any suitable level to provide a desired wavelength of light output. In some embodiments, Ce and/or Eu may be doped into a phosphor at a dopant concentration in a range of about 0.1% to about 20%. Suitable phosphors are available, from numerous suppliers, including Mitsubishi Chemical Corporation, Tokyo, Japan, Leuchtstoffwerk Breitungen GmbH, Breitungen, Germany, and Internatix Company, Fremont, Calif.

The BSR light in bins B1-B5 is combined with the BSY light to produce white light having a color point P7 at a CCT between about 2000 K and 6000 K, and in particular between about 2500 K to about 4500 K. Thus, a line segment L on a 1931 CIE Chromaticity diagram between a color point P3 of combined light emitted by the first LED and the red phosphor and the color point P6 of light emitted by the second LED and the yellow phosphor the may cross the planckian locus between about 2500 Kelvin and 4500 Kelvin.

Although the color points P1 and P3 are illustrated in FIG. 7 as being at different locations, it will be appreciated that the color points P1 and P3 may be at the same location, i.e., the blue LEDs that are used to generate BSR light may have the same dominant wavelength as the blue LEDs that are used to generate BSY light.

The use of separate blue LEDs to generate both BSR and BSY light may provide certain advantages, in that the phosphors that are used to generate BSR light and BSY light may be separated from one another, so that light emitted by one phosphor is not substantially reabsorbed by another phosphor (i.e., any incidental absorption that may occur may be insubstantial). For example, light generated by the yellow phosphor in the BSY LED may fall within the excitation region of the red phosphor used to generate the BSR light. Thus, some of the yellow light that constitutes the BSY light may be undesirably reabsorbed if the phosphors were combined on the same emitter.

Figure 8:
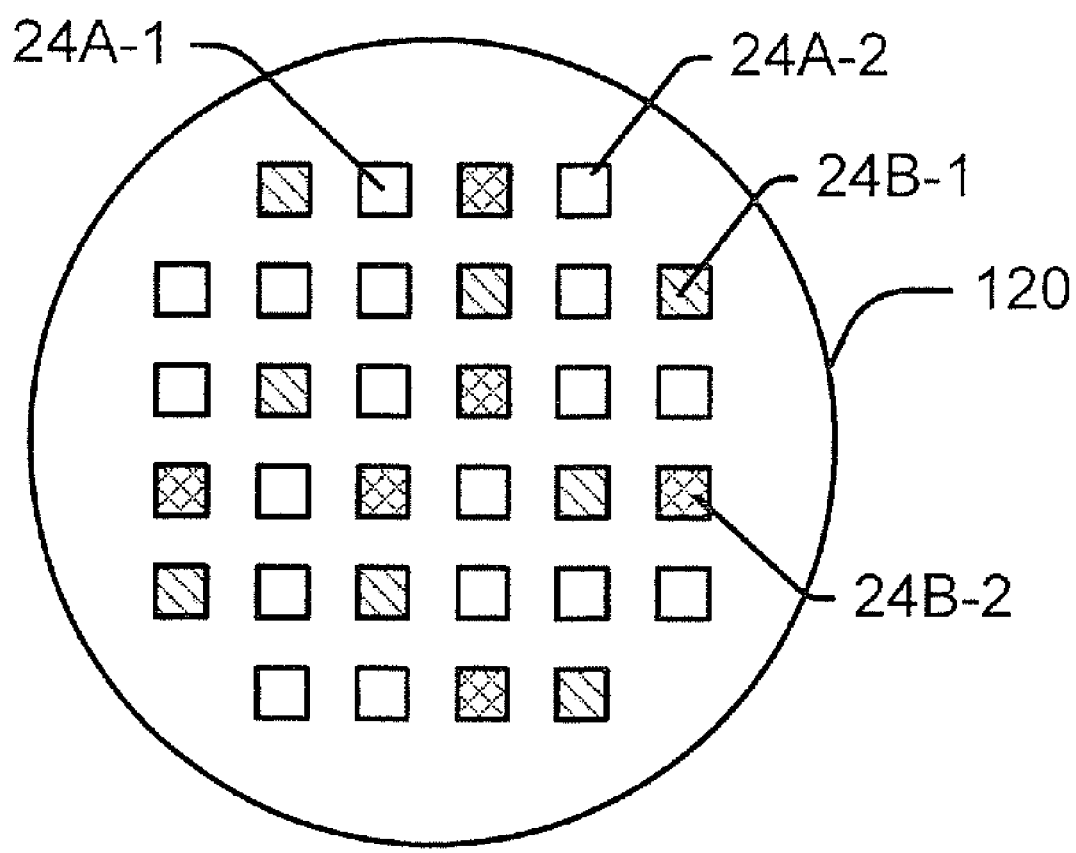
FIG. 8 illustrates portions of a solid state lighting apparatus according to further embodiments.

A single lighting device may include LEDs from multiple BSR bins and/or multiple BSY bins. For example, referring to FIG. 8, a single lighting device may include a plurality of first BSR LEDs 24A-1 and second BSR LEDs 24A-2, and/or a plurality of first BSY LEDs 24B-1 and second BSY LEDs 24B-2. The first BSR LEDs 24A-1 may fall within a first bin of the BSR bins B1 to B5, while the second BSR LEDs 24A-2 may fall within a second bin of the BSR bins B1 to B5 that is different from the first bin. Similarly, the first BSY LEDs 24B-1 may fall within a first portion of the BSY region 50 (FIG. 7), while the second BSY LEDs 24B-2 may fall within a second portion of the BSY region 50 that is different from the first portion. The first and second portions of the BSY region 50 may be distinguished in that they may be centered around color points that are at separated by at least a seven step Macadam ellipse, and in some cases by at least a ten step Macadam ellipse. The bins B1-B5 may be selected or defined such that a line segment between any point in the bins B1-B5 and any point in the BSY region 50 may cross the planckian locus at a point that is between about 2500 K and 6000K.

Accordingly, a lighting apparatus according to some embodiments may include first and second BSR LEDs that emit perceptibly different colors of light and/or first and second BSY LEDs that emit perceptibly different colors of light. Light from the first and second BSR LEDs and the first and second BSY LEDs may combine to generate warm white light having a CCT between about 2000 K and 6000 K, and in particular between about 2500 K to about 4500 K.

In some embodiments, brighter and dimmer LEDs 24A, 24B may be alternated in the linear array. For embodiments of some types, the LEDs 24A, 24B may be wired in two or more groups with independent current control or duty cycle control. The result will generally be a uniform high-efficiency light emitting diode illumination module 20.

As discussed previously, one of the significant challenges with mass production of illumination assemblies in which multiple LEDs 24 are employed is potential nonuniformity of color and/or luminosity arising from variations in the chromaticity and intensity/flux of the LED devices employed, and/or variations in the fluorescent media used for color conversion, if employed.

In order to contend with such non-uniformities, it is typical to 100% measure, sort and physically group (i.e. bin) the LED devices prior to their placement in a luminaire assembly or a multi-LED subassembly. However, this approach can present a serious logistics problem if the device-to-device variation in color and/or luminosity is large, as is often the case. In this case, the problem arising is that while physical sorting and grouping the devices into assembly may manage uniformity well for individual assemblies, there may still be in large differences from assembly to assembly. If multiple assemblies are used in an installation (such as multiple light fixtures in the ceiling of an office), the difference from assembly to assembly can become very obvious and objectionable. A common solution to this is for an assembly company making luminaires to purchase and utilize only a fraction of the LED device population after they are binned. In this fashion, all the fixtures made of by that company should come out appearing similar. But this poses yet another challenge, namely, what is to be done with all the other LED devices sorted and grouped but not purchased for making fixtures. Accordingly, some embodiments can address this problem, thereby potentially achieving simultaneously high uniformity within an assembly, high similarity from assembly to assembly, and/or elevated utilization of the production distribution of the LED devices.

Figure 9:
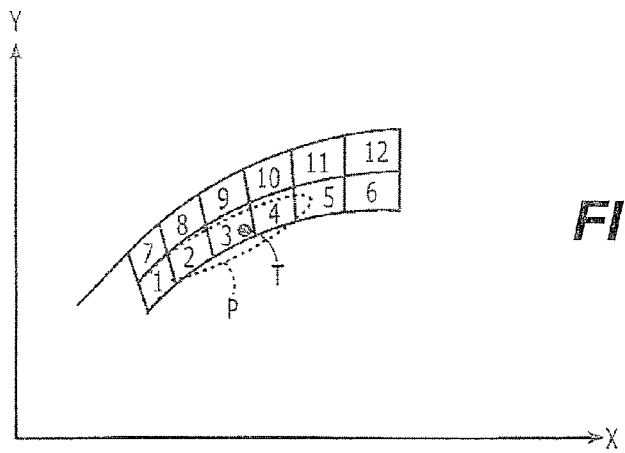
FIG. 9 illustrates a portion of a two-dimensional chromaticity space including bin locations and a production locus.

As an example, consider the binning system for white LEDs illustrated in FIG. 9, which is a portion of a 1931 CIE chromaticity diagram. As shown therein, a particular production system produces LEDs having a chromaticity falling within a production locus P. The locus P represents the variation boundaries in two-dimensional chromaticity space for the distribution of a production recipe, for example. The two-dimensional chromaticity space may, for example, be the 1931 CIE chromaticity space. The numbered polygons 1-12 illustrated in FIG. 9 are chromaticity bins. As each member of the LED production population is tested, the chromaticity of the LED is determined, and the LED is placed in an appropriate bin. Those members of the population having the same bin associations may be sorted and grouped together. It is common for a luminaire manufacturer to use members from one of these bins to make assemblies to assure uniformity within a multi-LED assembly and similarity between all such assemblies. However, much of the locus P would be left unused in such a situation.

Some embodiments provide enhanced mixing of light (by use of the recycling cavities 32, 34 bounded by reflective and other optical sheets, diffusers, BEFs, etc.) into which light from the LEDs 24 is injected. Some embodiments can also employ alternate binary additive color mixing to achieve metameric equivalent assemblies. "Binary additive color mixing" means the use of two light sources (e.g. LED devices) of a known different chromaticity within an optical homogenizing cavity to combine the two illuminations, such that a desired third apparent color is created. The third apparent color can result from a variety of alternate binary combinations that may all be the same in two-dimensional chromaticity space (i.e. metameric equivalents).

Referring still to FIG. 9, a production population chromaticity locus P is shown as at least partially covering five bin groups 1-5.

Figure 10:
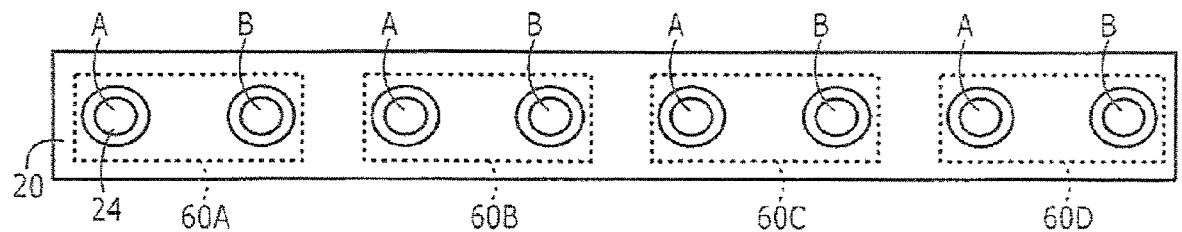
FIG. 10 illustrates placement of various type of LEDs on a linear illumination module according to some embodiments.

Referring to FIG. 10, a linear illumination module 20 is shown including a plurality of LED devices 24 for use in illumination assembly. As shown in FIG. 10, two alternating groups of LED devices are labeled a group A and group B. The LED devices 24 are grouped into groupings 60, referred to herein as metameric groupings 60A-60D. Chromaticities of the LEDs 24 of the metameric groupings 60A-60D are selected so that a combined light generated by a mixture of light from each of the LEDs 24 of the metameric groupings 60A-60D may include light having about a target chromaticity T. Two points in a two-dimensional chromaticity space are considered to have about the same chromaticity if one point is within a seven step Macadam ellipse of the other point, or vice versa. A Macadam ellipse is a closed region around a center point in a two-dimensional chromaticity space, such as the 1931 CIE chromaticity space, that encompasses all points that are visually indistinguishable from the center point. A seven-step Macadam ellipse captures points that are indistinguishable to an ordinary observer within seven standard deviations.

A two-dimensional chromaticity space may include a 1931 CIE chromaticity space or a 1976 CIE chromaticity space.

Figure 11:
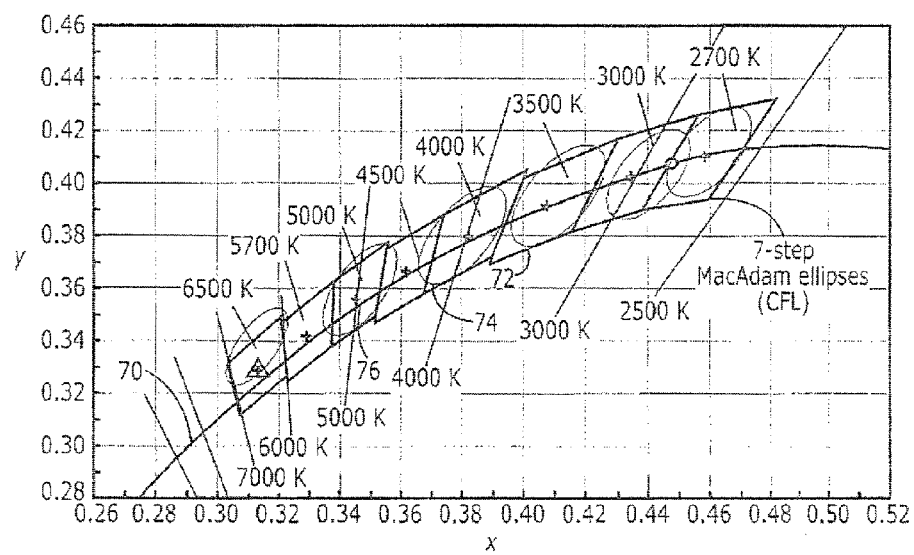
FIG. 11 illustrates a portion of a two-dimensional chromaticity space including the black-body radiation curve and correlated color temperature (CCT) quadrangles of light generally considered white.

In some embodiments, the chromaticity of each of the LEDs 24 of a metameric groupings 60A-60D may be within about a seven step Macadam ellipse about a point on a blackbody radiation curve on a 1931 CIE chromaticity space from a correlated color temperature (CCT) of 4000K to 8000K. Thus, each of the LEDs 24 may individually have a chromaticity that is within a region that is generally considered to be white. For example, FIG. 11 illustrates a portion of a 1931 CIE diagram including the black-body radiation curve 70 and a plurality of CCT quadrangles, or bins, 72. Furthermore, FIG. 11 illustrates a plurality of 7-step Macadam ellipses 74 around various points 76 on or near the black-body radiation curve 70.

However, in some embodiments, one or more of the LEDs 24 of a metameric grouping 60A-60D may have a chromaticity that is outside a seven step Macadam ellipse about a point on a black-body radiation curve on a 1931 CIE chromaticity space from a correlated color temperature of 4000K to 8000K, and thus may not be considered white to an observer.

Thus, to achieve a desired series of illuminator assemblies with such a linear module 20 with the series having substantially equal apparent chromaticity at the target point T, each assembly thus providing a metameric equivalent of chromaticity T, the following three alternate pairs of A/B binary additive combinations may be used:

A and B are from Bin three.

A and B are from Bins two and four, respectively.

A and B are from Bins one and five, respectively.

Accordingly, an adjacent pair of devices A and B in the module 20 may be selected based on their actual chromaticity points being about equidistant from the target chromaticity point T, or being in bins that are about equidistant from the bin in which the target chromaticity point T is located.

By considering the effects of luminosity in additive color mixing, some embodiments provide additional binary pairs effective to create the same metameric equivalent target T chromaticity assembly. A luminosity (luminous intensity, luminous flux, etc.) ranking system of three ascending ranges of luminosity can be defined, for example, as:

Af: 85 to 90 lumens

Bf: 90 to 95 lumens

Cf: 95 to 100 lumens

Then, additional allowable pairs for the previous example may include:

A and B are Bin two, Rank Cf, and Bin five Rank Af, respectively

A and B are Bin four, Rank Cf and Bin one, Rank At, respectively

A and B are Bin three, Rank Af and Bin three, Rank Cf, respectively

Thus, each of the LEDs 24 of each metameric grouping 60A-60D may have a luminosity that is generally inversely proportional to a distance of a chromaticity of the LED 24 to the target chromaticity T in a two-dimensional chromaticity space.

Accordingly, an adjacent group of devices A and B in the module 20 may be selected to provide a desired light output. In a binary system, for example, where a first device of the pair of devices is closer to the target chromaticity point T, the first device may have a higher brightness than the second device of the pair of devices. Likewise, where a first device of the pair of devices is farther form the target chromaticity point T, the first device may have a lower brightness than the second device of the pair of devices. Where the devices are in chromaticity bins that are about equidistant from the target chromaticity point, the devices may have about the same brightness. Thus, in some embodiments, each of the LEDs 24 of a metameric grouping 60A-60D may have about the same luminosity and may have a chromaticity that is about the same distance from the target chromaticity T in two dimensional chromaticity space.

By using an effective homogenizer, using alternate mixing to achieve equivalent metameric targets from a multitude of bin groupings and/or an alternating LED device layout of the linear module 20, it may be possible to utilize a large proportion of distribution locus P while still achieving a product distribution with good uniformity within each luminaire assembly and/or good similarity among a produced series of luminaire assemblies. The better the recycling homogenizing effect, the greater differences between devices that constitute a metameric grouping are allowable without impacting uniformity.

Although binary groupings are illustrated in FIG. 9, it will be appreciated that ternary, quaternary and higher-order versions may also be utilized, in which a metameric grouping includes three or more LED devices.

Furthermore, by providing groupings which, when driven with substantially the same current are utilized to provide the desired target chromaticity, the LEDs may be driven a single string of LEDs. Accordingly, the drive circuitry for driving the LEDs may be simplified over multiple string approaches, such as RGB approaches, that use current to control the intensity of the LEDs and thereby control the resultant chromaticity of the combined output may be avoided. Such a resultant target chromaticity may be the overall target chromaticity of the overall lighting device or may be the target chromaticity for a component, such as a desired BSY or BSR color point, of the lighting device. Thus, a combination of LEDs that provide a target chromaticity may be provided in a single string, whereas the overall output of the lighting device may be provided by multiple strings of such groups of LEDs.

Figure 12:
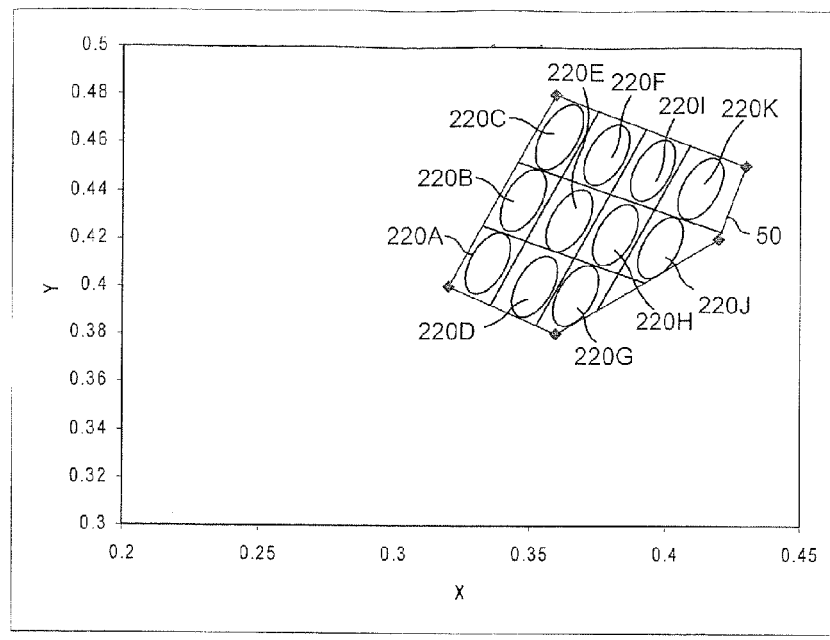
FIG. 12 illustrates a portion of a 1931 CIE Chromaticity Diagram including a non-white region that has been subdivided into bins.

For example, referring to FIG. 12, a portion of a 1931 CIE Chromaticity Diagram including a BSY region 50 is illustrated therein. The BSY region 50 is further subdivided into a plurality of sub-regions, or bins, 220A to 220K, each of which is defined to have a size that is approximately the size of a seven step Macadam ellipse centered about a point near the middle of the bin, as illustrated in FIG. 12.

It is well known that there is some variation in color point of a phosphor converted LED, even when known phosphor materials are applied in a consistent manner, due to light variations in process conditions or device characteristics. Thus, when two LEDs having a known dominant wavelength are packaged together with the same phosphor material, the color point of the resulting devices may fall into different bins. It is further known that the color point of a particular device can be adjusted by adjusting the amount of drive current that is used to energize the device.

Thus, in some manufacturing techniques for solid state lighting systems, individual devices may be manufactured, tested and sorted into bins based on their color points. Devices from a given bin can then be selected and connected in a series string. Depending on the bin from which the devices were selected, a current level can be selected at which the string can be driven to produce light having a desired color point. That is, each device in a string may be selected from the same bin and, driven at a chosen drive current so that the string produces light having a desired color point.

One drawback to this approach, however, is that depending on the distribution of color points in a given batch of packaged devices, it may be difficult to select sufficient numbers of devices from the same bin to populate a large number of lighting devices, so that some wastage can occur.

Furthermore, it may be difficult, expensive and/or time consuming to determine the appropriate drive current and configure or adjust a current generator and/or LED string so that the desired color point of light is produced.

Figure 13:
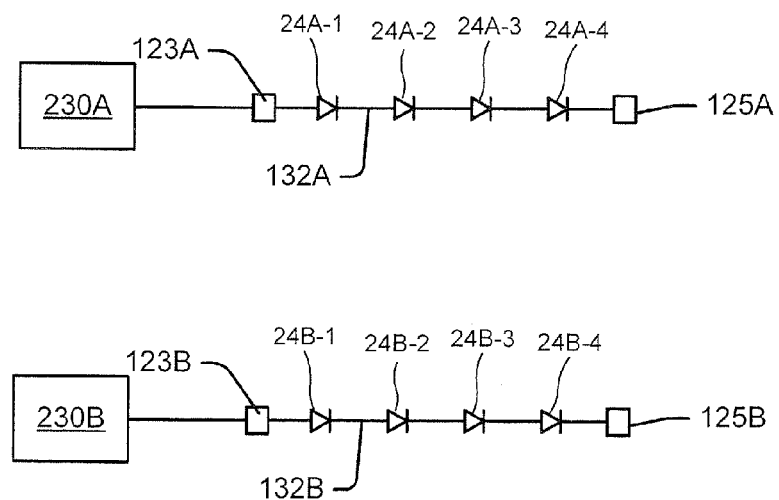
FIG. 13 is a circuit diagram illustrating interconnection of LEDs in a solid state lighting apparatus according to some embodiments.

Accordingly, referring to FIG. 13, some embodiments provide a solid state lighting apparatus that includes a plurality of light emitting diodes (LEDs) 24A-1 to 24A-4 connected in series to form an LED string 132A. Each of the LEDs includes an LED device configured to emit light having a dominant wavelength of, for example, about 430 nm to 480 nm and a phosphor configured to receive at least some of the light emitted by the LED device and responsively emit light having about a second dominant wavelength, of, for example, about 550 nm to about 580 nm. LEDs in the string 132A may have color points that fall into different bins 220A-220K. That is, a combined light emitted by the LED device and the phosphor of a first one of the plurality of LEDs has a first color point that falls within a first one of the bins 220A-220K, and a combined light emitted by the LED device and the phosphor of a second one of the plurality of LEDs has a second color point that falls within a different one of the bins 220A-220K. In particular, the second color point may fall outside a seven step Macadam ellipse around the first color point.

As illustrated in FIG. 12, however, the first color point and the second color point may each fall within the BSY area 50 on a 1931 CIE Chromaticity Diagram. As noted above, the BSY area 50 is a polygon defined by points having x, y coordinates of (0.32, 0.40), (0.36, 0.48), (0.43, 0.45), (0.42, 0.42), (0.36, 0.38). Accordingly, the light generated by the string 132A may have a non-white color point that falls outside a ten-step Macadam ellipse around any point on the planckian locus between 2000 Kelvin and 8000 Kelvin.

The solid state lighting apparatus may further include a constant current source 230A. The plurality of LEDs 24A-1 to 24A-4, having different color points, is coupled to the constant current source 230A and receives a constant current supplied by the constant current source 230A. Each of the plurality of LEDs 24A-1 to 24A-4, having different color points, is thereby energized with the same current, and the resulting light output by the string 132A may have a desired color point.

According to some embodiments, therefore, the color point of combined light emitted by the LED string 132A may be determined based on light emission of each of the LEDs 24A-1 to 24A-4 in the string 132A at a given reference current that will be supplied by the constant current source 230A. There may therefore be no need to adjust the current supplied by the constant current source 230A to adjust the color point of light emitted by the LED string 132A.

The apparatus may further include a second plurality of LEDs 24B-1 to 24B-4 connected in series to form a string 132B. Each of the second LEDs 24B-1 to 24B-4 includes an LED device configured to emit light having a third dominant wavelength and a phosphor configured to receive at least some of the light emitted by the LED device and responsively emit light having a fourth dominant wavelength. In some embodiments, the fourth dominant wavelength may be at least about 25 nm higher than the second dominant wavelength. That is, the phosphors may emit substantially different wavelengths of light. A combined light emitted by the LED device and the phosphor of a first one of the second plurality of LEDs has a third color point and a combined light emitted by the LED device and the phosphor of a second one of the second plurality of LEDs has a fourth color point that falls outside a seven step Macadam ellipse of the third color point. That is, the second LED string 132B includes LEDs having different color points.

In some embodiments, the third dominant wavelength may be from about 430 nm to about 480 nm, and the fourth dominant wavelength may be from about 600 nm to about 630 nm, so that the second string 132B emits magenta or BSR light. A combined light emitted by the first and second strings 132A, 132B may comprise white light. In particular, a line segment on a 1931 CIE Chromaticity diagram between a color point of combined light emitted by the first string 132A and the color point of light emitted by the second string 132B may cross the planckian locus between about 2500 Kelvin and 4500 Kelvin.

The solid state lighting apparatus may further include a second constant current source 230B coupled to the second string 132B. The second constant current source 230B may be configured to supply the same level of current as the constant current source 230A. In some embodiments, the two strings 132A, 132B may be driven by the same constant current source.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A solid state lighting apparatus comprising:
   a plurality of light emitting diodes (LEDs), each of the LEDs comprising an LED device configured to emit light having about a first dominant wavelength and a phosphor configured to receive at least some of the light emitted by the LED device and responsively emit light having a second dominant wavelength wherein each of the plurality of LED devices emits substantially the same color of light and each of the plurality of LEDs comprises the same phosphor;
   wherein a combined light emitted by the LED device and the phosphor of a first one of the plurality of LEDs has a first color point and a combined light emitted by the LED device and the phosphor of a second one of the plurality of LEDs has a second color point that falls outside a seven step Macadam ellipse around the first color point.

2. The solid state lighting apparatus of claim 1, wherein the first color point and the second color point each fall within a defined area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

3. The solid state lighting apparatus of claim 2, wherein a chromaticity of combined light emitted by the plurality of LEDs has a color point that falls within the defined area on a 1931 CIE Chromaticity Diagram.

4. The solid state lighting apparatus of claim 2, wherein a chromaticity of combined light emitted by the plurality of LEDs has a color point that falls outside a ten-step Macadam ellipse around any point on the planckian locus between 2000 Kelvin and 8000 Kelvin.

5. The solid state lighting apparatus of claim 2, wherein the defined area on a 1931 CIE Chromaticity Diagram comprises a plurality of bins, each of the plurality of bins having approximately a size of a seven step Macadam ellipse, wherein the first color point falls in a first one of the plurality of bins and the second color point falls within a second one of the plurality of bins.

6. The solid state lighting apparatus of claim 1, further comprising:
   a constant current source, wherein the plurality of LEDs is coupled to the constant current source and receives a constant current supplied by the constant current source.

7. The solid state lighting apparatus of claim 1, wherein the first dominant wavelength is from about 430 nm to about 480 nm.

8. The solid state lighting apparatus of claim 7, wherein the second dominant wavelength is from 600 nm to 630 nm.

9. The solid state lighting apparatus of claim 7, wherein the second dominant wavelength is from 550 nm to 580 nm.

10. The solid state lighting apparatus of claim 1, wherein the first dominant wavelength is from about 500 nm to about 530 nm.

11. The solid state lighting apparatus of claim 10, wherein the second dominant wavelength is from 600 nm to 630 nm.

12. The solid state lighting apparatus of claim 10, wherein the second dominant wavelength is from 550 nm to 580 nm.

13. The solid state lighting apparatus of claim 1, wherein the plurality of LEDs comprises a first plurality of LEDs, the apparatus further comprising a second plurality of LEDs, each of the second LEDs comprising an LED device configured to emit light having a third dominant wavelength and a phosphor configured to receive at least some of the light emitted by the LED device and responsively emit light having a fourth dominant wavelength, wherein the fourth dominant wavelength is at least 25 nm higher than the second dominant wavelength;
wherein a combined light emitted by the LED device and the phosphor of a first one of the second plurality of LEDs has a third color point and a combined light emitted by the LED device and the phosphor of a second one of the second plurality of LEDs has a fourth color point that falls outside a seven step Macadam ellipse of the third color point.

14. The solid state lighting apparatus of claim 13, wherein the first dominant wavelength is from about 430 nm to about 480 nm, the second dominant wavelength is from 550 nm to 580 nm, the third dominant wavelength is from about 430 nm to about 480 nm, and the fourth dominant wavelength is from 600 nm to 630 nm.

15. The solid state lighting apparatus of claim 13, wherein the first dominant wavelength is from about 430 nm to about 480 nm, the second dominant wavelength is from 550 nm to 580 nm, the third dominant wavelength is from about 500 nm to about 530 nm, and the fourth dominant wavelength is from 600 nm to 630 nm.

16. The solid state lighting apparatus of claim 13, further comprising:
a first constant current source, wherein the first plurality of LEDs is coupled to the first constant current source and receives a constant current supplied by the first constant current source; and
a second constant current source, wherein the second plurality of LEDs is coupled to the second constant current source and receives a constant current supplied by the second constant current source.

17. The solid state lighting apparatus of claim 13, wherein a line segment on a 1931 CIE Chromaticity diagram between a color point of combined light emitted by the first plurality of LEDs and the color point of light emitted by the second plurality of LEDs crosses the planckian locus between about 2500 Kelvin and 4500 Kelvin.

18. The solid state lighting apparatus of claim 1, wherein the plurality of LEDs comprises a first plurality of LEDs, the apparatus further comprising a second plurality of LEDs connected in series, each of the second LEDs comprising an LED device configured to emit light having a third dominant wavelength that is from about 600 nm to about 630 nm.

19. The solid state lighting apparatus of claim 18, wherein a line segment on a 1931 CIE Chromaticity diagram between a color point of combined light emitted by the first plurality of LEDs and the color point of light emitted by the second plurality of LEDs crosses the planckian locus between about 2500 Kelvin and 4500 Kelvin.

20. A solid state lighting apparatus comprising:
a current source; and
a string of light emitting diodes (LEDs) connected to the current source and configured to emit light in response to a drive current supplied by the current source, each of the LEDs in the string comprising an LED device configured to emit light having a first dominant wavelength and a phosphor configured to receive at least some of the light emitted by the LED device and responsively emit light having a dominant wavelength that is different from the first dominant wavelength wherein each of the plurality of LED devices in the string emits substantially the same color of light and each of the plurality of LEDs in the string comprises the same phosphor;
wherein a combined light emitted by the LED device and the phosphor of a first one of the plurality of LEDs has a first color point and a combined light emitted by the LED device and the phosphor of a second one of the plurality of LEDs has a second color point that falls outside a seven step Macadam ellipse around the first color point.

* * * * *